(12) United States Patent
Shinozaki

(10) Patent No.: US 7,835,172 B2
(45) Date of Patent: Nov. 16, 2010

(54) SYSTEM AND METHOD OF OPERATION FOR RESISTIVE CHANGE MEMORY

(75) Inventor: Naoharu Shinozaki, Kanagawa (JP)

(73) Assignee: Spansion LLC, Sunnyvale, CA (US)

( * ) Notice: Subject to any disclaimer, the term of this patent is extended or adjusted under 35 U.S.C. 154(b) by 104 days.

(21) Appl. No.: 12/243,836

(22) Filed: Oct. 1, 2008

(65) Prior Publication Data

US 2009/0251945 A1 Oct. 8, 2009

(30) Foreign Application Priority Data

Oct. 1, 2007 (JP) ............................. 2007-257969

(51) Int. Cl.
G11C 11/00 (2006.01)
G11C 11/24 (2006.01)

(52) U.S. Cl. .................... 365/148; 365/149; 365/163

(58) Field of Classification Search .................. 365/148
See application file for complete search history.

(56) References Cited

U.S. PATENT DOCUMENTS

| | | | |
|---|---|---|---|
| 7,233,520 B2 * | 6/2007 | Daley | 365/163 |
| 7,251,154 B2 * | 7/2007 | Hush | 365/148 |
| 7,295,462 B2 * | 11/2007 | Farnworth | 365/158 |
| 7,331,011 B2 * | 2/2008 | Nagai | 714/773 |
| 7,529,116 B2 * | 5/2009 | Jung et al. | 365/149 |
| 2005/0035373 A1 * | 2/2005 | Ishida et al. | 257/202 |
| 2006/0145240 A1 * | 7/2006 | Park et al. | 257/315 |
| 2006/0152961 A1 * | 7/2006 | Kim et al. | 365/148 |
| 2007/0195581 A1 * | 8/2007 | Morimoto | 365/148 |
| 2007/0247894 A1 * | 10/2007 | Shiimoto et al. | 365/148 |
| 2008/0116438 A1 * | 5/2008 | Lee et al. | 257/2 |
| 2008/0291716 A1 * | 11/2008 | Futatsuyama et al. | 365/148 |
| 2010/0046287 A1 * | 2/2010 | Widjaja | 365/163 |

* cited by examiner

*Primary Examiner*—Son L Mai

(57) ABSTRACT

The present invention provides a semiconductor device and a method for manufacturing thereof. The semiconductor device includes a data storage element which includes a variable resistance and an electrode, and a controller which selects a first mode that stores data by the resistance value of the variable resistance and a second mode that stores data by the amount of electrical charges stored in the electrode. By selectively using the data storage element in the first mode and the second mode, a plurality of storage modes can be implemented with a single data storage element. Thus, miniaturization and cost reduction of the semiconductor device can be achieved.

29 Claims, 18 Drawing Sheets

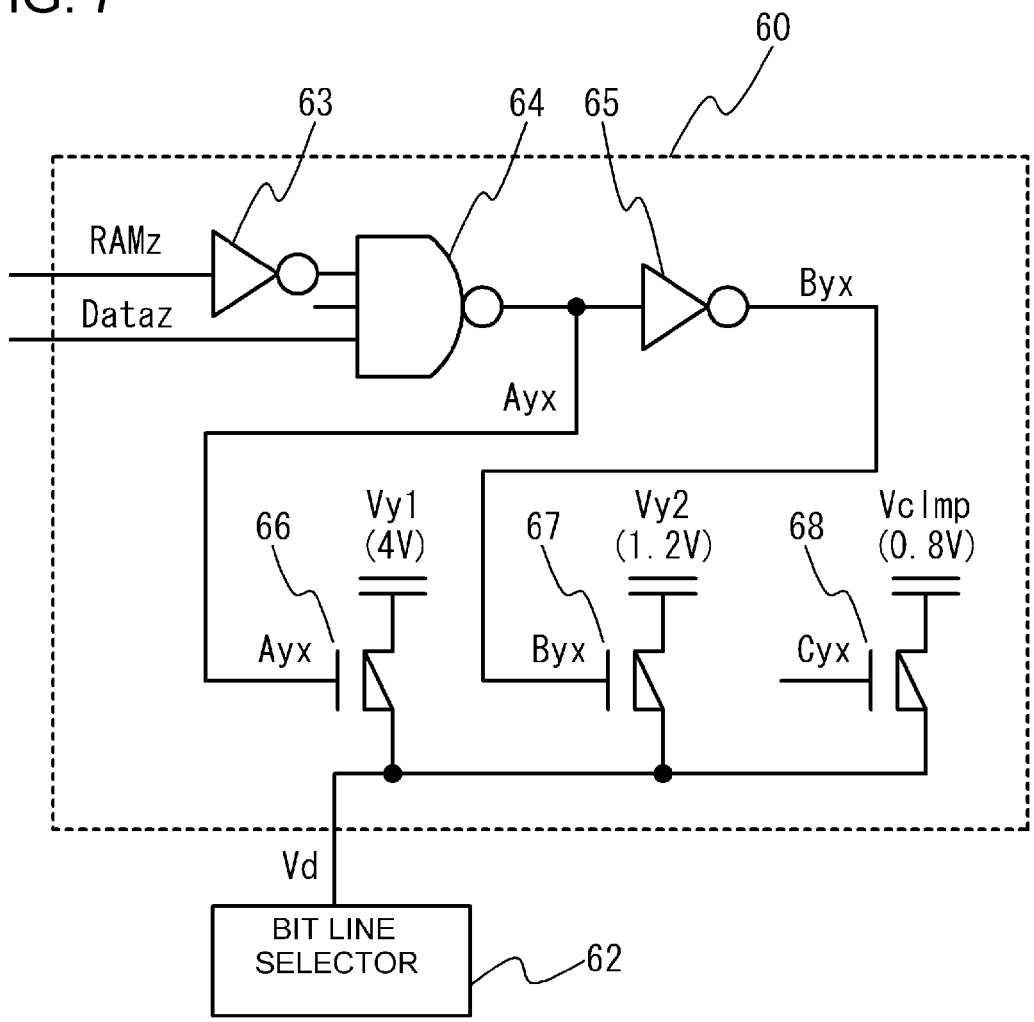

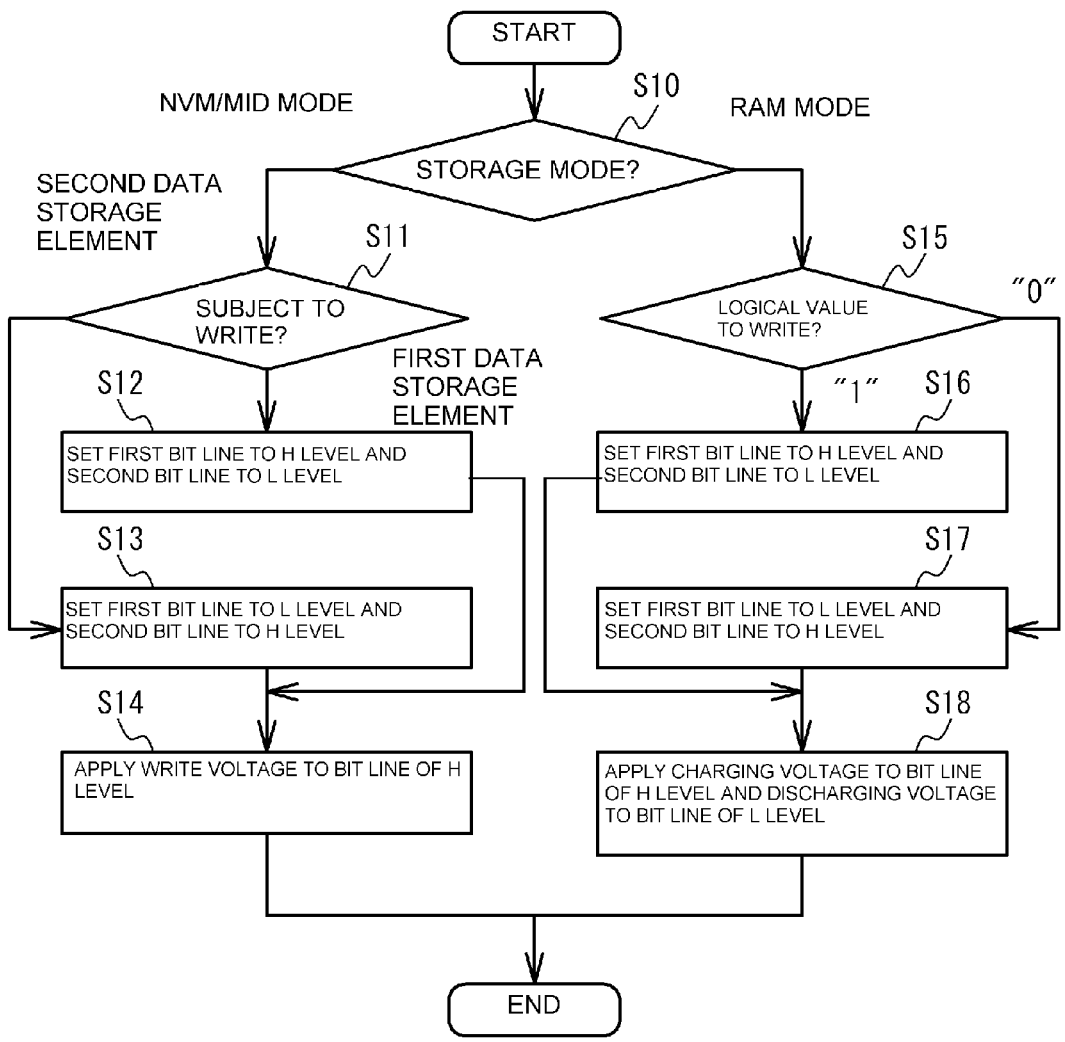

SYSTEM AND METHOD OF OPERATION FOR RESISTIVE CHANGE MEMORY

CLAIM OF PRIORITY

This application claims priority from Japanese patent application 2007-257969 filed on Oct. 1, 2007

TECHNICAL FIELD

The present invention relates to a semiconductor device having a volatile and non-volatile data storage element.

BACKGROUND ART

Typical data storage elements used in semiconductor devices may include volatile storage elements such as dynamic random access memory (DRAM) and static random access memory (SRAM), and non-volatile storage elements such as a flash memory and an EEPROM. A volatile storage element is capable of writing and reading data at a high speed, but lacks capability for data retention persisting through a loss or stoppage of power. Non-volatile storage elements are capable of persistent data retention, but typical write and read speeds are slower than those of volatile storage elements.

In general, a volatile storage element is suitable for applications of fast data processing while the power is turned on; meanwhile, a non-volatile storage element is suitable for applications for storing data for a long time, even when the power is turned off. In order to take respective advantages of these two storage elements, a semiconductor device provided with both volatile storage elements and non-volatile storage elements and having a configuration of exchanging data between the respective storage elements according to operation status has been developed. Japanese Patent Application Publications Nos. JP-A-2006-295130 and JP-A-2006-302466 disclose examples of such semiconductor devices.

A semiconductor device having a storage element which stores data by variations in resistivity of a variable resistance has been developed. For example, Japanese Patent Application Publication No. JP-A-2007-59918 discloses a semiconductor device provided with a storage element having a phase-change layer.

In the semiconductor devices disclosed in JP-A-2006-295130 and in JP-A-2006-302466, volatile storage elements and non-volatile storage elements are separately provided. Therefore, as space for providing both types of the respective storage elements is required, miniaturization of the semiconductor device is difficult.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

One aspect of the present invention provides a semiconductor device including: a data storage element; and a controller that selects a first mode that stores data by a resistance value of a variable resistance, and a second mode that stores data by an amount of electrical charges stored in an electrode. According to this aspect of the present invention, by selectively using the data storage element in the first mode and the second mode, a plurality of storage modes can be implemented with a single data storage element. Thus, miniaturization and cost reduction of the semiconductor device can be achieved.

In the above-described arrangement, the first mode may store data by changing the variable resistance to either a high resistive state or a low resistive state; and the second mode may store data by changing the electrode to either a charged state or a discharged state.

In addition, the controller may control a time during which a voltage is applied to the data storage element when writing data in the first mode to be longer than a time during which a voltage is applied to the data storage element when writing data in the second mode. Furthermore, the controller may maintain the variable resistance at the high resistive state when the second mode is selected. With this arrangement, insulating performance of the electrode in the second mode can be enhanced, whereby the data retention time in the second mode can be made longer.

In the above-described arrangement, the controller may control the voltage applied to the electrode when writing data in the second mode to be lower than a threshold voltage for changing the variable resistance from the high resistive state to the low resistive state. With this arrangement, the variable resistance can be maintained at the high resistive state in the second mode.

In the above-described arrangement, the controller may apply, when writing data in the first mode, a voltage higher than the threshold voltage to the data storage element when changing the variable resistance to the low resistive state, and may apply a voltage lower than the threshold voltage to the data storage element for a longer time than when changing the variable resistance to the low resistive state when changing the variable resistance to the high resistive state. With this arrangement, a state of the variable resistance can be changed further reliably.

The above-described arrangement may also include a select transistor in which either a source or a drain is coupled to the data storage element. The controller may control a current flowing through the data storage element by controlling a gate voltage of the select transistor, and may control a gate voltage when changing the variable resistance to the low resistive state when writing data in the first mode to be smaller than a gate voltage when changing the variable resistance to the high resistive state when writing data in the first mode and when in the second mode. With this arrangement, a voltage applied to the data storage element can be easily controlled by the select transistor.

In the above-described arrangement, the controller may perform a refresh operation of the data storage element when the second mode is selected. With this arrangement, the data retention time in the second mode can be made longer.

The above-described arrangement may also include: the data storage element including a first data storage element and a second data storage element; and a pair of bit lines composed of a first bit line to which the first data storage element is coupled and a second bit line to which the second data storage element is coupled. The controller may set, when writing data in the first mode, the first bit line to a high level and the second bit line to a voltage level lower than a high level when writing to the first data storage element, and may set the second bit line to a high level and the first bit line to a voltage level lower than a high level when writing to the second data storage element. The controller may set, when writing data in the second mode, the first bit line to a high level and the second bit line to a low level when writing a logical high to the first data storage element and the second data storage element, and may set the first bit line to a low level and the second bit line to a high level when writing a logical low to the first data storage element and the second data storage element. With this arrangement, since a common circuit configuration can be used in the first mode and the second mode, the semiconductor device can be miniaturized and the manufacturing cost can be reduced.

In the above-described arrangement, the controller: may apply, when writing data in the first mode, a voltage for changing the variable resistance to either a high resistive state or a low resistive state to a bit line which is set to a high level among the first bit line and the second bit line; and may apply, when writing data in the second mode, a voltage for charging electrical charges to the electrode to a bit line which is set to a high level among the first bit line and the second bit line, and may apply a voltage for discharging the electrode to a bit line set to a low level.

The above-described arrangement may also include: the data storage element including a first data storage element and a second data storage element; and a pair of bit lines composed of a first bit line to which the first data storage element is coupled and a second bit line to which the second data storage element is coupled. The controller may read out data, when reading out data from the first data storage element in the first mode, by raising the second bit line up to a reference voltage that is referred to when reading data, raising the first bit line to a voltage higher than the reference voltage, conducting the first data storage element and the first bit line, and comparing voltages, after performing the conducting, of the first bit line and the second bit line. The controller may read out data, when reading out data from the first data storage element in the second mode, by raising the first bit line and the second bit line up to the reference voltage, conducting the data storage element and the first bit line, and comparing voltages, after performing the conducting, of the first bit line and the second bit line. With this arrangement, since a common circuit configuration can be used in the first mode and the second mode, the semiconductor device can be miniaturized and the manufacturing cost can be reduced.

The above-described arrangement may also include a detector circuit coupled to the first bit line and the second bit line. The controller may perform control such that, when reading data in the first mode and the second mode, a potential difference between the first bit line and the second bit line in the detector circuit is amplified. With this arrangement, reading data from the data storage element can be performed further accurately.

In the above-described arrangement, the detector circuit may be used in common in the first mode and the second mode.

In the above-described arrangement, the controller may short-circuit, when reading data in the first mode and the second mode, the first bit line and the second bit line after reading out data. With this arrangement, power consumption of the circuit can be suppressed.

In the above-described arrangement, the controller may select, in addition to the first mode and the second mode, a third mode that stores data by changing the variable resistance to either a high resistive state or a low resistive state. A resistance value when the variable resistance is in the high resistive state in the third mode may be smaller than a resistance value when the variable resistance is in the high resistive state in the first mode. A resistance value when the variable resistance is in the low resistive state in the third mode may be larger than a resistance value when the variable resistance is in the low resistive state in the first mode. With this arrangement, since the third mode can be selected in addition to the first mode and the second mode, the application of the semiconductor device 100 can be expanded.

In the above-described arrangement, the controller may control a time during which a voltage is applied to the data storage element when writing data in the third mode to be shorter than a time during which a voltage is applied to the data storage element when writing data in the first mode, and also to be longer than a time during which a voltage is applied to the data storage element when writing data in the second mode.

In the above-described arrangement, the controller may apply, when writing data in the third mode, a voltage higher than a threshold voltage for changing the variable resistance from the high resistive state to the low resistive state to the data storage element when changing the variable resistance to the low resistive state. The controller may apply a voltage lower than the threshold voltage to the data storage element for a longer time than when changing the variable resistance to the low resistive state when changing the variable resistance to the high resistive state.

The above-described arrangement may also include a select transistor in which either a source or a drain is coupled to the data storage element. The controller may control a current flowing through the data storage element by controlling a gate voltage of the select transistor, and may control a gate voltage when changing the variable resistance to the low resistive state when writing data in the third mode to be smaller than a gate voltage when changing the variable resistance to the high resistive state when writing data in the third mode and when in the second mode.

In the above-described arrangement, the controller performs, when the third mode is selected, a refresh operation of the data storage element at a longer interval than when the second mode is selected. With this arrangement, the data retention time in the third mode can be made longer.

The above-described arrangement may also include a select register that stores a mode of the data storage element. The controller may select a mode of the data storage element by referencing a value of the select transistor. With this arrangement, the mode can be selected electrically. Also, the mode can be changed easily as needed.

The above-described arrangement may also include a control terminal that inputs a mode of the data storage element to the controller. The controller may select a mode of the data storage element according to an input from the control terminal. With this arrangement, mechanically fixing of the mode becomes easy.

According to a second aspect of the present invention, a method for manufacturing a semiconductor device that includes a data storage element including a variable resistance and an electrode is provided. The method includes selecting a first step that stores data by changing the variable resistance to either a high resistive state or a low resistive state, and a second step that stores data by an amount of electrical charges stored in the electrode. According to this aspect of the present invention, by selectively using the data storage element in the first mode and the second mode, as a plurality of storage modes can be implemented with a single data storage element, miniaturization and cost reduction of the semiconductor device can be achieved.

In the above-described method, the first step may include writing data by applying a first voltage to the data storage element; the second step may include writing data by applying a second voltage to the data storage element. A time during which the first voltage is applied may be longer than a time during which the second voltage is applied.

In the above-described method, the semiconductor device may also include: the data storage element including a first data storage element and a second data storage element; and a pair of bit lines composed of a first bit line to which the first data storage element is coupled and a second bit line to which the second data storage element is coupled. The writing of the data to the data storage element in the first step may also include: setting, when writing to the first data storage element, the first bit line to a high level and the second bit line to a voltage level lower than a high level; and setting, when writing to the second data storage element, the second bit line to a high level and the first bit line to a voltage level lower than a high level. The writing of the data to the data storage element in the second step may also include: setting, when writing a logical high to the first data storage element and the second data storage element, the first bit line to a high level and the second bit line to a low level; and setting, when writing a logical low to the first data storage element and the second data storage element, the first bit line to a low level and the second bit line to a high level.

In the above-described method, the semiconductor device may also include: the data storage element including a first data storage element and a second data storage element; and a pair of bit lines composed of a first bit line to which the first data storage element is coupled and a second bit line to which the second data storage element is coupled. The first step may include: raising the second bit line up to a reference voltage that is referred to when reading data; raising the first bit line to a voltage higher than the reference voltage; conducting the data storage element and the first bit line; and reading out data by comparing voltages, after performing the conducting, of the first bit line and the second bit line. The second step may include: raising the first bit line and the second bit line up to the reference voltage; conducting the data storage element and the first bit line; and reading out data by comparing voltages, after performing the conducting, of the first bit line and the second bit line.

The above-described method may also include selecting any one of the first step, the second step, or a third step that stores data by changing the variable resistance to either a high resistive state or a low resistive state. A resistance value when the variable resistance is in the high resistive state in the third step may be smaller than a resistance value when the variable resistance is in the high resistive state in the first step. A resistance value when the variable resistance is in the low resistive state in the third step may be larger than a resistance value when the variable resistance is in the low resistive state in the first step.

In the above-described method, the third step may include writing data by applying a third voltage to the data storage element; and a time during which the third voltage is applied may be shorter than a time during which the first voltage is applied, and may be longer than a time during which the second voltage is applied.

According to some aspects of the present invention, by selectively using the data storage element in the first mode in which data is stored by the resistance value of the variable resistance and in the second mode in which data is stored by the amount of electrical charges stored in the electrode, a plurality of storage modes can be implemented with a single data storage element. Thus, miniaturization and cost reduction of the semiconductor device can be realized.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 7 is a schematic circuit diagram illustrating a configuration of a write circuit in accordance with various embodiments of the present invention;

FIG. 9 is a flowchart showing a data write operation of a semiconductor device in accordance with various embodiments of the present invention;

DETAILED DESCRIPTION

Reference will now be made in detail to the preferred embodiments of the claimed subject matter, a method and system for the use of a reputation service provider, examples of which are illustrated in the accompanying drawings. While the claimed subject matter will be described in conjunction with the preferred embodiments, it will be understood that they are not intended to be limit to these embodiments. On the contrary, the claimed subject matter is intended to cover alternatives, modifications and equivalents, which may be included within the spirit and scope as defined by the appended claims.

Furthermore, in the following detailed descriptions of embodiments of the claimed subject matter, numerous specific details are set forth in order to provide a thorough understanding of the claimed subject matter. However, it will be recognized by one of ordinary skill in the art that the claimed subject matter may be practiced without these specific details. In other instances, well known methods, procedures, components, and circuits have not been described in detail as not to unnecessarily obscure aspects of the claimed subject matter.

Figure 1:
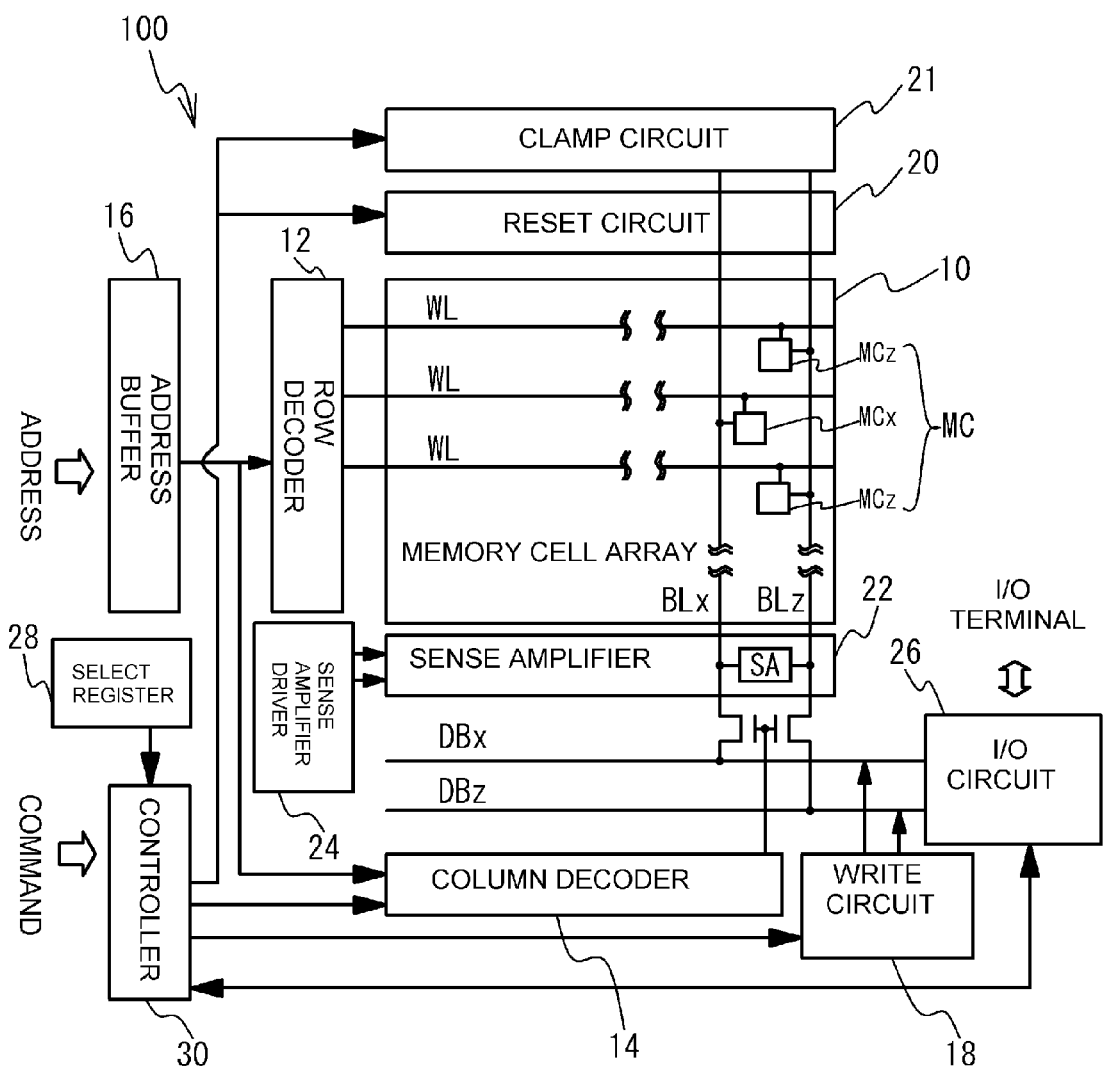
FIG. 1 is a schematic block diagram illustrating a configuration of a semiconductor device, in accordance with various embodiments of the present invention.

FIG. 1 is a schematic block diagram illustrating a configuration of a semiconductor device 100 according to various embodiments. In one embodiment, memory cell array 10 has a plurality of memory cells MC which includes a data storage element (not shown). In the memory cell array 10, a plurality of bit lines BL and word lines WL are respectively provided in parallel. One of the bit lines BL configures a bit line pair composed of a first bit line BLz and a second bit line BLx. One of the memory cells MC is provided at a crossing region of one of the bit lines BL and one of the word lines WL, and is respectively coupled to one of the word lines WL and one of the bit lines BL. As shown in FIG. 1, one of the memory cells MC includes a first memory cell MCz coupled to the first bit line BLz and a second memory cell MCx coupled to the second bit line BLx. The first memory cell MCz and the second memory cell MCx are alternately disposed on every other word line WL.

The word lines WL are coupled to a row decoder 12 to select rows and the bit lines BL are coupled to a column decoder 14 to select columns. By the combination of rows and columns, the memory cell MC subject to access is selected. An address signal to select a memory cell MC is respectively sent to the row decoder 12 and the column decoder 14 from the outside via an address buffer 16.

A data write circuit 18 provides a high voltage for writing data applied to the memory cell MC in data write. A reset circuit 20 provides a reference voltage Vref applied to the bit line BL in data read. A clamp circuit 21 provides a clamp voltage Vclmp applied to the bit line BL in data read. A sense amplifier 22 reads and amplifies a signal from the memory cell MC. A sense amplifier driver 24 drives the sense amplifier 22 in data read.

An I/O circuit 26 exchanges data between the memory cell array 10 and the outside. A select register 28 stores information relevant to a storage mode of the semiconductor device 100. A controller 30 selects the storage mode of the semiconductor device 100 based on the information relevant to the storage mode stored in the select register 28. Further, the controller 30 controls, according to a command signal from the outside, the write circuit 18, the reset circuit 20, the clamp circuit 21 and the I/O circuit 26. Furthermore, the controller 30 selects, by controlling the column decoder 14, from the bit line pair composed of the first bit line BLz and the second bit line BLx, a single bit line to which a voltage to be applied in data write or in data read.

Figure 2:
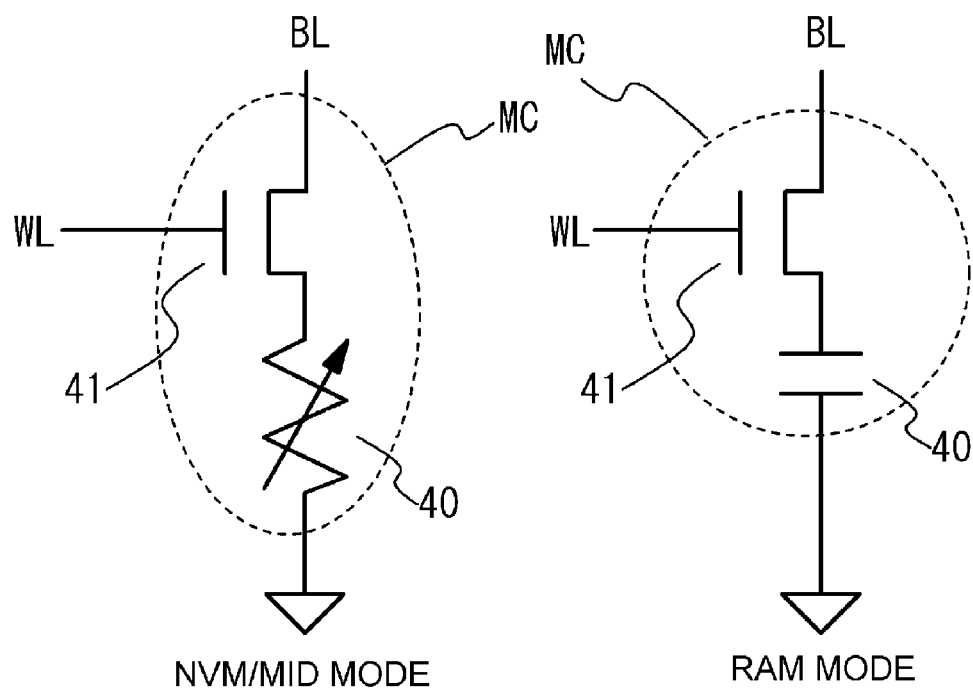
FIGS. 2A and 2B illustrate configurations of a memory cell in accordance with various embodiments of the present invention.

FIGS. 2A and 2B depict schematic circuit diagrams illustrating configurations of a memory cell MC shown in FIG. 1. According to one embodiment, the memory cell MC has a data storage element 40 and a select transistor 41 which controls an access to the data storage element 40. A gate of the select transistor 41 is coupled to the word line WL, a drain thereof is coupled to the bit line BL, and a source thereof is coupled to the data storage element 40. The data storage element 40 serves, according to the storage mode of the semiconductor device 100, as either one of a capacitance or a variable resistance. This will be described in detail in a subsequent section. One end of the data storage element 40 is coupled to a source line not shown (a ground potential) or an arbitrary voltage level (a potential).

Figure 3:
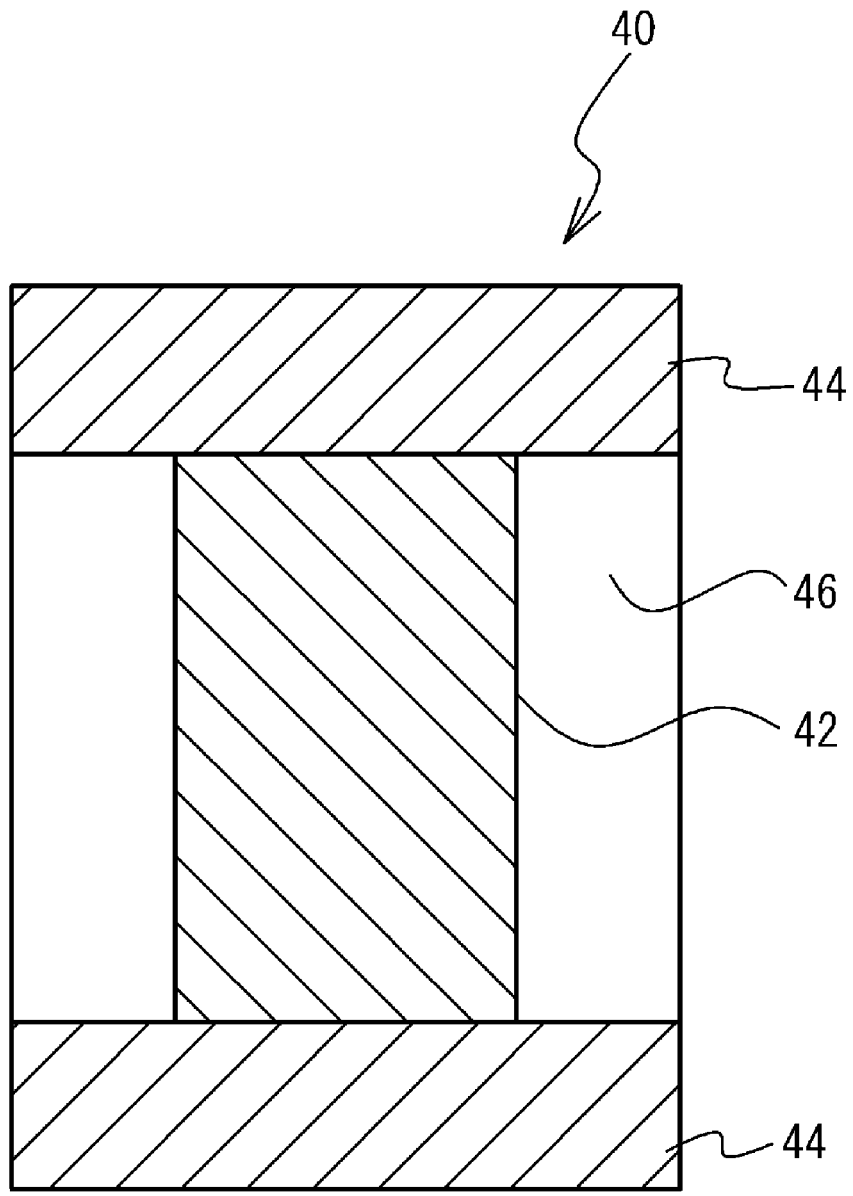
FIG. 3 illustrates a configuration of a data storage element in accordance with various embodiments of the present invention.

FIG. 3 is a cross-sectional view illustrating a configuration of the data storage element shown in FIGS. 2A and 2B. According to one embodiment, the data storage element 40 includes a variable resistance 42 and an electrode 44. The variable resistance 42 stores data by determining resistance values and is composed of a material of which resistance value is largely varied (e.g., $10^4$ times or more) by the flow of an electric current. As for such materials, a transition metal oxide including $CuO$, is available. The electrodes 44 store data by storing electrical charges as a capacitance and are composed of a highly conductive material such as copper. The electrodes 44 are provided on both ends of the variable resistance 42. The surroundings of the variable resistance 42 are covered with an insulator 46.

With reference to Table 1, the storage mode of the semiconductor device 100 will be described. The semiconductor device 100 of the first embodiment has three storage modes (an NVM mode, a RAM mode and a MID mode). In a first mode of the NVM mode of a non-volatile property, data is stored by changing the variable resistance 42 to either a high resistive state or a low resistive state. For example, a logic 0 is stored when the variable resistance 42 is in the high resistive state (e.g., $10^8$ ohms) and, when in the low resistive state (e.g., $10^2$ ohms), a logic 1 is stored. In a second mode of the RAM mode of a volatile property, data is stored by the amount of electrical charges stored in the electrodes 44 of a capacitance. Thus, the logic 0 is stored when electrical charges are not stored in the capacitance (a discharged state) and, when electrical charges are stored (a charged state), the logic 1 is stored.

A third mode of the MID mode lies halfway between the NVM mode and the RAM mode. In the MID mode, as the same as those in the NVM mode, while data is stored by changing the variable resistance 42 to either a high resistive state or a low resistive state, the resistance value of the variable resistance 42 in the high resistive state in the MID mode is smaller (e.g., $10^7$ ohms) than the resistance value of the variable resistance 42 in the high resistive state in the NVM mode, and the resistance value of the variable resistance 42 in the low resistive state in the MID mode is larger (e.g., $10^3$ ohms) than the resistance value of the variable resistance 42 in the low resistive state in the NVM mode. More specifically, the difference in resistance values between the high resistive state and the low resistive state of the variable resistance 42 in the MID mode is smaller than that in the NVM mode. The data storage element 40 serves as a variable resistance in the NVM mode and the MID mode as shown in FIG. 2A, and serves as a capacitance in the RAM mode as shown in FIG. 2B.

TABLE 1

| Mode name | Data storage method | Corresponding logical value | |
| --- | --- | --- | --- |
| | | 0 | 1 |
| NVM mode | Resistance of variable resistance | High resistance ($10^8$ ohms) | Low resistance ($10^2$ ohms) |
| RAM mode | Charge amount in capacitance | Discharged | Charged |
| MID mode | Resistance of variable resistance | High resistance ($10^7$ ohms) | Low resistance ($10^3$ ohms) |

The data storage element 40 can serve, depending on an amount of a flowing current and a duration of a voltage applied, as a storage element having three different data storage methods. In other words, switching of three storage modes is carried out by controlling the flowing current through the data storage element 40 and the time the voltage is applied to the data storage element 40. In the first embodiment, by controlling the operations of the write circuit 18 with the controller 30, the reset circuit 20, the clamp circuit 21 and the I/O circuit 26, the voltages applied to the gate and drain of the select transistor 41 in the memory cell MC are controlled. This will be described below.

Table 2 depicts examples of gate voltages Vg and drain voltages Vd of the select transistor 41 and voltage apply times corresponding to data write and read operations in each storage mode. The voltage apply time can be controlled, for example, by varying a pulse width of a voltage pulse applied to the data storage element 40.

TABLE 2

| Operation | Gate voltage Vg[V] | Drain voltage Vd[V] | Voltage apply time S[ns] |
|---|---|---|---|
| NVM mode | | | |
| Write (High resistance, 0) | 2.5 | 1.2 | 250 |
| Write (Low resistance, 1) | 1.2 | 4 | 100 |
| Read | 1.0 | Vclmp | — |
| RAM mode | | | |
| Write (Discharged, 0) | 2.5 | 0 | 10 |
| Write (Charged, 1) | 2.5 | 1.2 | 10 |
| Read | 2.5 | Vref | — |
| MID mode | | | |
| Write (High resistance, 0) | 2.5 | 1.2 | 50 |
| Write (Low resistance, 1) | 1.2 | 4 | 50 |
| Read | 1.0 | Vclmp | — |

Figure 4:
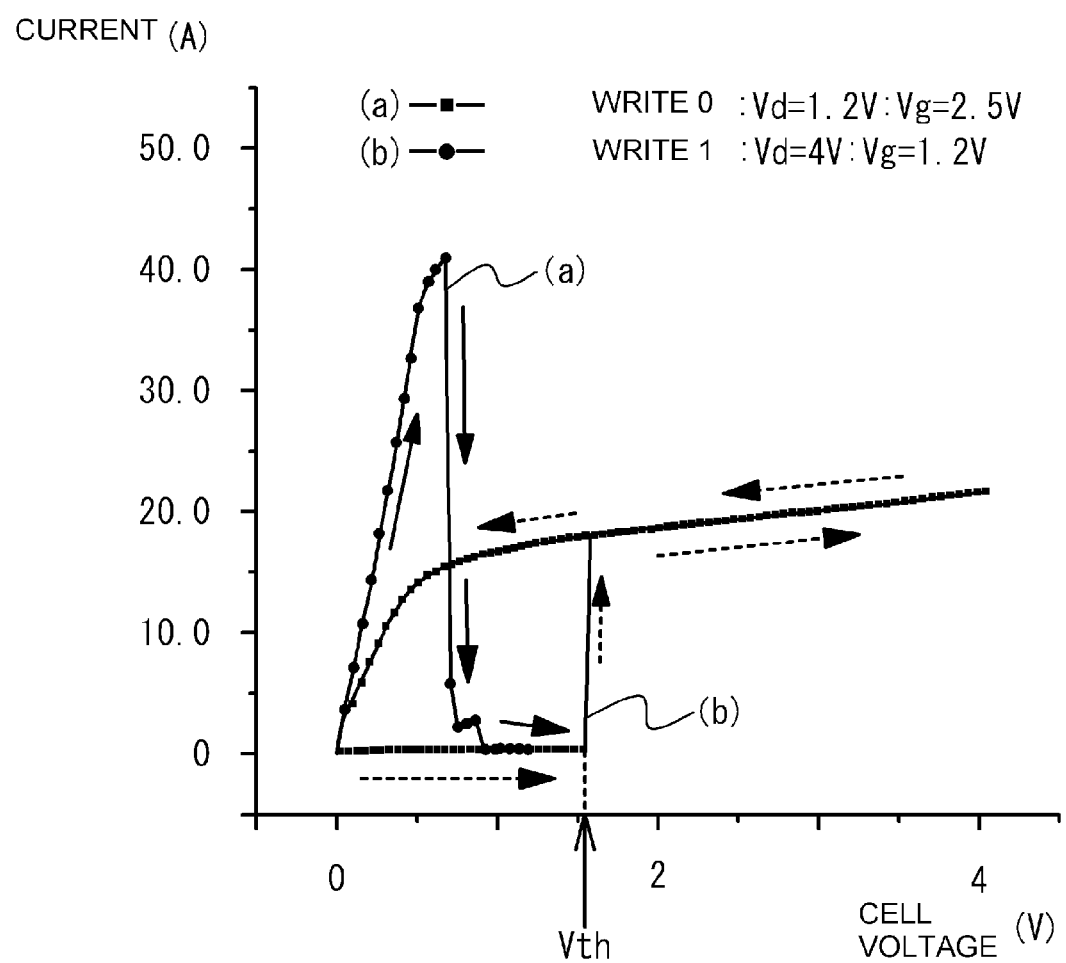
FIG. 4 is a chart illustrating voltage-current characteristics of a data storage element in accordance with various embodiments of the present invention.

First, the voltage conditions in data write and read in the NVM mode will be described. FIG. 4 is a chart showing voltage-current characteristics of the data storage element 40. A line (a) shown by solid arrows indicates changes of the voltage-current characteristics of the variable resistance 42 in the data storage element 40 shifting from the low resistive state to the high resistive state. A line (b) shown by dashed arrows indicates changes of the voltage-current characteristics of the variable resistance 42 shifting from the high resistive state to the low resistive state. In the data storage element 40, there is a threshold voltage Vth for the variable resistance 42 to change from the high resistive state to the low resistive state. When writing the logic 0, a voltage lower than the threshold voltage Vth is applied for a given length of time.

Consequently, the current hardly flows through the data storage element 40 after a predefined time is passed and the variable resistance 42 shifts from the low resistive state to the high resistive state as shown by the line (a). In this case, the gate voltage Vg is 2.5 V, the drain voltage Vd is 1.2 V and the voltage apply time S is 250 ns (Table 2). When writing the logic 1, a voltage higher than the threshold voltage Vth is applied. Consequently, the current flows through the data storage element 40 and the variable resistance 42 shifts from the high resistive state to the low resistive state as shown by the line (b). In this case, the gate voltage Vg is 1.2 V, the drain voltage Vd is 4 V and the voltage apply time S is 100 ns (Table 2). The voltage apply time for changing the variable resistance 42 to the high resistive state is longer than that for changing the variable resistance 42 to the low resistive state. Furthermore, the gate voltage Vg for changing the variable resistance 42 to the high resistive state is higher than that for changing the variable resistance 42 to the low resistive state.

When reading data in the NVM mode, a voltage which is lower than the threshold voltage Vth and is lower than the voltage for shifting the variable resistance 42 to the high resistive state is applied to the data storage element 40. Consequently, as a current flows when the variable resistance 42 is in the low resistive state and as no current flows when in the high resistive state, logics 0 and 1 can be judged. This will be described in detail in a subsequent section. In this case, the gate voltage Vg is 1.0 V and the drain voltage Vd equals to the Vclmp.

Next, the voltage conditions in data write and read in the RAM mode will be described. With reference to Table 2, in the RAM mode, the gate voltage Vg of the select transistor 41 is constantly at 2.5 V. This is the same voltage condition as when shifting the variable resistance 42 to the high resistive state in the NVM mode. More specifically, in the RAM mode, the variable resistance 42 is maintained in the high resistive state. When writing the logic 0, by applying a low voltage (e.g., a ground potential Vss) to the data storage element 40, the electrical charges stored in the electrodes 44 are discharged. In this case, the drain voltage Vd is 0 V and the voltage apply time S is 10 ns. When writing the logic 1, by applying a high voltage to the data storage element 40, electrical charges are charged to the electrodes 44. In one embodiment, the drain voltage Vd is 1.2 V and the voltage apply time S is 10 ns. In the RAM mode, only the electrical charges are transferred to or from the electrodes 44 and the variable resistance 42 does not change its state. Therefore, the voltage apply time in the NVM mode may be longer than that in the RAM mode. Further, the voltage applied to the electrodes 44 is typically lower than the threshold voltage of the data storage element 40. When reading data in the RAM mode, the reference voltage Vref to read data is applied to the data storage element 40.

Next, the voltage conditions in data write and read in the MID mode will be described. With reference to Table 2, in the MID mode, the gate voltage Vg and the drain voltage Vd of the select transistor 41 are the same as those in the NVM mode, but the voltage apply times only differ. In the MID mode, the voltage apply time S in data write is 50 ns. Specifically, the voltage apply time S in data write in the MID mode is typically longer than the voltage apply time in data write in the RAM mode, but is typically shorter than the voltage apply time in data write in the NVM mode. According to some embodiments, the voltage conditions in data read in the MID mode may be the same as those in the NVM mode.

The voltage applied to the data storage element 40 in data write in the NVM mode is defined as a first voltage, the voltage applied to the data storage element 40 in data write in the RAM mode is defined as a second voltage, and the voltage applied to the data storage element 40 in data write in the MID mode is defined as a third voltage. In one embodiment, the apply time of the first voltage is the longest followed by the third voltage and the second voltage and the apply time gets shorter in that order.

Table 3 shows properties of the data storage element 40 in each storage mode. The values shown in parentheses are just examples and the properties of the data storage element of the present invention are not limited to these. According to one embodiment, the data retention time is long (e.g., 10 years) while an access speed is slow (e.g., 300 ns) in the NVM mode, showing a property closer to that of a conventional non-volatile semiconductor memory. In the RAM mode, the access speed is fast (e.g., 50 ns) while the data retention time is short (e.g., 1 second) showing a property closer to that of a volatile semiconductor memory (DRAM and such) of related art. In order to retain data for a long time, a refresh operation needs to be carried out at a constant interval. In the MID mode, both the data retention time (e.g., 1 day) and the access speed (e.g., 70 ns) have intermediate values between the NVM mode and the RAM mode. By carrying out a refresh operation in the same manner as in the RAM mode, the data retention time can be extended. Further, writing data in the NVM mode and in the MID mode involves status changes of the variable resistance 42, which causes damage to the data storage element 40 and limits the number of rewriting data therein (e.g., 10,000 times in the NVM mode and 100,000 times in the MID mode). In the RAM mode, only transferring electrical charges to or from the electrodes 44 is carried out, which causes little damage to the data storage element 40 and enables rewriting to be practically infinitely carried out.

TABLE 3

| Mode | Access speed | Data retention time | Number of rewrites |
| --- | --- | --- | --- |
| NVM mode | Slow (300 nsec) | Long (10 years) | Finite (10,000 times) |
| RAM mode | Fast (50 nsec) | Short (1 second) | Infinite |
| MID mode | Intermediate (70 nsec) | Intermediate (1 day) | Finite (100,000 times) |

Figure 5:
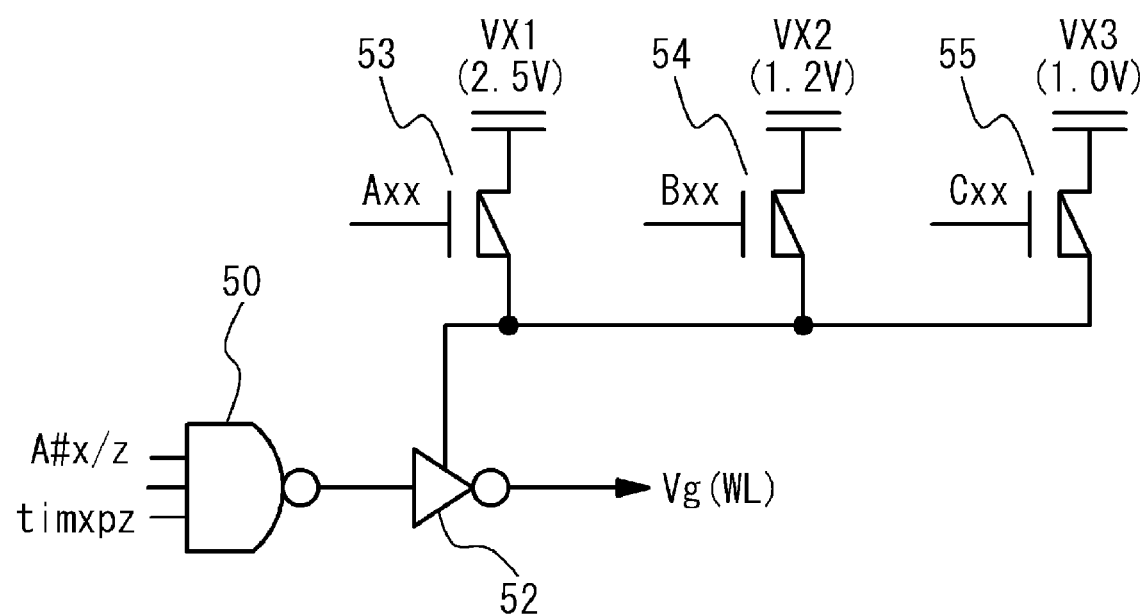
FIG. 5 is a schematic circuit diagram illustrating a configuration of a row decoder in accordance with various embodiments of the present invention.

Next, the specific circuit configurations and operations of the semiconductor device 100 relevant to data write will be described. FIG. 5 is a schematic circuit diagram illustrating the configuration of the row decoder 12 shown in FIG. 1. Slash marked transistors 53 to 55 are of pMOS transistors and, according to inputs Axx to Cxx to respective gate terminals, voltages V×1 to V×3 applied to respective source terminals are selected. Drain terminals of the pMOS transistors 53 to 55 are coupled to the gate terminal of the select transistor 41 via the word line WL and the voltage selected from the voltages V×1 to V×3 is applied to the select transistor 41 as the gate voltage Vg. With reference to Table 2, the V×1 is 2.5 V and is selected when writing the logic 0 in the NVM mode and the MID mode, and in the RAM mode. The V×2 is 1.2 V and is selected when writing the logic 1 in the NVM mode and the MID mode. The V×3 is 1.0 V and is selected when reading data in the NVM mode and the MID mode. A NAND gate 50 is fed with an address signal A#x/z to select the word line and a timing signal Timxpz to control a rise and a fall of the gate voltage Vg of the select transistor 41. When the address signal A#x/z is at a high (H) level, according to the timing signal Timxpz, one of the voltages from V×1 to V×3 is applied to the word line WL via an inverter 52.

Figure 6:
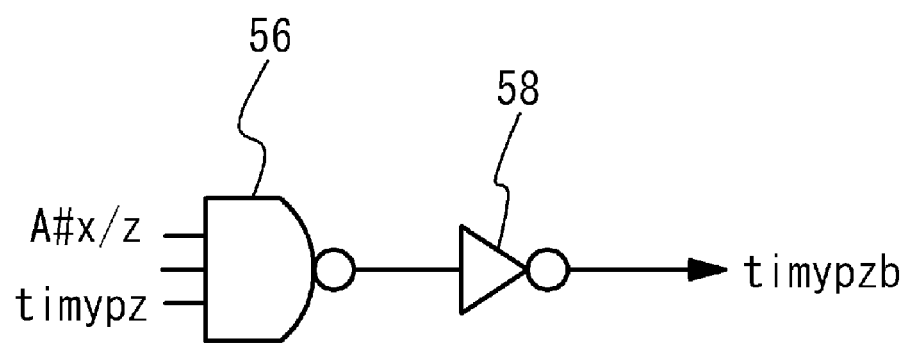
FIG. 6 is a schematic circuit diagram illustrating a configuration of a column decoder in accordance with various embodiments of the present invention.

FIG. 6 is a schematic circuit diagram illustrating the configuration of the column decoder 14 shown in FIG. 1. A NAND gate 56 is fed with the address signal A#x/z to select the bit line and a timing signal Timypz to control a rise and a fall of the drain voltage Vd of the select transistor 41. An inverter 58 inverts the output of the NAND gate 56. When the address signal A#x/z is at a high (H) level, according to the timing signal Timypz, a control signal Timypzb is output to the write circuit 18. Here, the column decoder 14 selects the bit line pair composed of a single bit line to which the memory cell MC subject to access is coupled and of another single bit line corresponding to the single bit line. Of the two bit lines configuring the bit line pair, one single bit line which the drain voltage Vd is applied to is selected by a later described bit line selector 62 (FIG. 8).

FIG. 7 is a schematic circuit diagram illustrating the configuration of the write circuit 18 shown in FIG. 1. The write circuit 18 is provided with a voltage selector 60 and the bit line selector 62. In pMOS transistors 66 to 68 in the voltage selector 60, voltages Vy1, Vy2 and Vclmp are applied to their respective source terminals. The drain terminals of the pMOS transistors 66 to 68 are coupled to the drain terminal of the select transistor 41 via the bit line selector 62 and the bit line BL, and the voltage selected from the voltages Vy1, Vy2 and Vclmp is applied as the drain voltage Vd of the select transistor 41. With reference to Table 2, the Vy1 is 4 V and is selected when writing the logic 1 in the NVM mode and the MID mode. The Vy2 is 1.2 V and is selected when writing the logic 0 in the NVM mode and the MID mode and when charging in the RAM mode. The Vclmp is 0.8 V and is selected when reading data in the NVM mode and the MID mode.

A NAND gate 64 is fed with a signal RAMz inverted by an inverter 63 as well as a signal DATAz corresponding to the logical value to be stored in the data storage element 40. In the RAM mode, as the signal RAMz becomes the H level, the output of the NAND gate 64 constantly stays at the H level. The output of the NAND gate 64 is inverted by an inverter 65 and is fed to the gate terminal of the transistor 67. Consequently, the transistor 67 is turned on and the voltage Vy2 is selected. In the NVM mode and the MID mode, as the signal RAMz becomes at an L level, the voltage is selected according to the signal DATAz. More specifically, when the signal DATAz is at the L level (when writing the logic 0), the output of the NAND gate 64 becomes the H level and, in the same manner as in the RAM mode, the transistor 67 is turned on and the voltage Vy2 is selected. When the signal DATAz is at the H level (when writing the logic 1), the output of the NAND gate 64 is at the L level and, as the transistor 66 is turned on, the voltage Vy1 is selected.

In one embodiment of the semiconductor device 100, the bit line pair composed of the first bit line BLz and the second bit line BLx is provided and the memory cell MC is alternately placed on each bit line. Therefore, between the NVM mode and the RAM mode, the selection methods of the bit line to be applied with the drain voltage Vd differ. This will be described below.

Figure 8A:
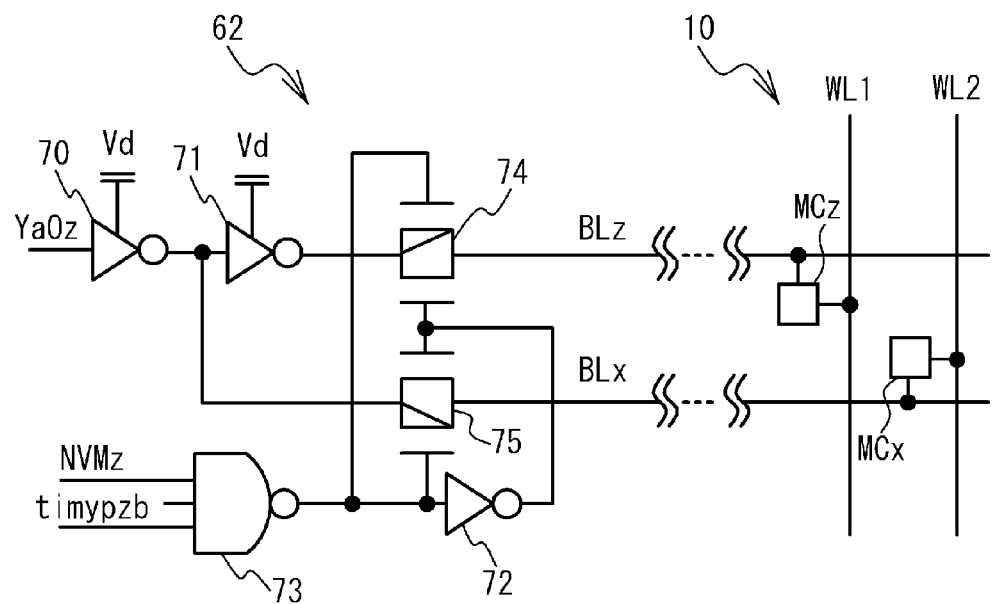
FIGS. 8A and 8B illustrate configurations of a bit line selector and a part of a memory cell array in accordance with various embodiments of the present invention
Figure 8B:
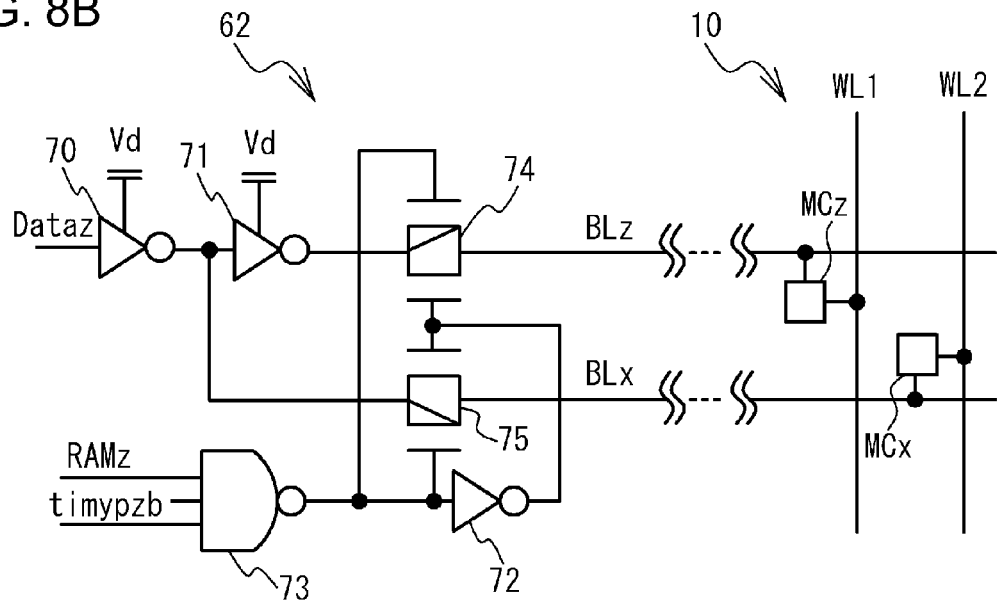

FIG. 8 shows schematic circuit diagrams illustrating the configurations of the bit line selector 62 shown in FIG. 7 and a part of the memory cell array 10 shown in FIG. 1. FIG. 8A corresponds to the NVM mode and the MID mode and FIG. 8B corresponds to the RAM mode. The bit line selector 62 is configured with inverters 70 to 72, a NAND gate 73, and pass gates 74 and 75. In the inverters 70 and 71, the drain voltage Vd selected by the voltage selector 60 is applied. The pass gate 74 is coupled to the first bit line BLz and the pass gate 75 is coupled to the second bit line BLx. The first bit line BLz is coupled to the first memory cell MCz having the first data storage element and the second bit line BLx is coupled to the second memory cell MCx having the second data storage element.

With reference to FIG. 8A, in the NVM mode or the MID mode, as a signal NVMz fed to the NAND gate 73 becomes the H level, according to the timing signal Timypzb fed from the column decoder 14 (FIG. 6), the pass gates 74 and 75 are switched on or off. Further, a signal Ya0z fed to the inverter 70 is the address signal which selects the bit line coupled to the memory cell subject to write data out of the bit line pair composed of the first bit line BLz and the second bit line BLx.

With reference to FIG. 8B, in the RAM mode, as the signal RAMz fed to the NAND gate 73 becomes the H level, according to the timing signal Timypzb fed from the column decoder 14 (FIG. 6), the pass gates 74 and 75 are switched on or off. Further, the signal DATAz fed to the inverter 70 is the logical value of data written to the memory cell. Here, a logical high is defined to correspond to the logic 1 in Table 1 and a logical low is defined to correspond to the logic 0 in Table 1.

FIG. 9 is a flowchart illustrating a control flow of the semiconductor device 100 in data write operation. First, in a step S10, the controller 30 judges the storage mode of the semiconductor device 100. When in the NVM mode and the MID mode, a step S11 is proceeded to and, when in the RAM mode, a step S15 is proceeded to.

In the NVM mode and the MID mode, according to the position of the memory cell MC having the data storage element 40 subject to write, the bit line to be applied with a write voltage is selected. First, the controller 30 judges the memory cell MC subject to write (step S11). When writing to the first data storage element in the first memory cell MCz, the controller 30 selects the first bit line BLz. In one embodiment, as the signal Ya0z becomes the H level, the first bit line BLz is set to a high (H) level and the second bit line BLx is set to a lower voltage level (e.g., a half the power supply voltage Vcc) than the H level (step S12). When writing to the second data storage element in the second memory cell MCx, the controller 30 selects the second bit line BLx. In a further embodiment, as the signal Ya0z becomes the L level, the second bit line BLx is set to the H level and the first bit line BLz is set to a lower voltage level than the H level (step S13).

Next, the controller 30, applies the write voltage to the bit line which is set to the H level in the step S12 or S13 and writes data (step S14) by controlling the write circuit 18. The write voltage applied to the bit line is the drain voltage Vd selected by the voltage selector 60 (FIG. 7) and is to change the variable resistance 42 in the data storage element 40 to either one of the high resistivity state or the low resistivity state.

With reference to FIG. 9, when the RAM mode is judged in the step S10, according to the logical value to be stored in the data storage element 40 in the memory cell MC, the bit line to be applied with the write voltage is selected. First, the controller 30 judges the logical value of data to be written to the memory cell MC (step S15). When writing the logic 1 (the logical high), the controller 30 selects the first bit line. In this case, as the signal DATAz becomes the H level, the first bit line BLz is set to the H level and the second bit line BLx is set to the L level (step S16). When writing the logic 0 (the logical low), the controller 30 selects the second bit line (step S17). In this case, as the signal DATAz becomes the L level, the first bit line BLz is set to the L level, and the second bit line BLx is set to the H level (step S17).

Next, the controller 30, by controlling the write circuit 18, applies a voltage to charge electrical charges to the electrodes 44 in the data storage element 40 to the bit line which is set to the H level in the step S16 or S17, writes data (step S18). The write voltage applied to the bit line which is set to the H level is the drain voltage Vd selected by the voltage selector 60 (FIG. 7). Further, the controller 30, to the bit line which is set to the L level, simultaneously applies a voltage (e.g., the Vss) to discharge electrical charges from the electrodes 44 in the data storage element 40. This completes the data write to the data storage element 40.

In the RAM mode, regardless of which bit line the memory cell MC subject to write is coupled to, the bit line to be applied with the drain voltage Vd is selected according to the logical value to be stored in the memory cell MC. Therefore, the logical value to be stored in the memory cell MC (hereinafter an external logic) and the logical value which represents the state of the data storage element 40 in the memory cell MC (see Table 1, hereinafter an internal logic) are not always in accord.

For example, when storing the logic 1 in the first memory cell MCz (the external logic is 1), as the signal DATAz becomes the H level and the first bit line BLz is set to the H level, the first memory cell MCz is charged (the internal logic is 1). When storing the logic 0 in the first memory cell MCz (the external logic is 0), as the signal DATAz becomes the L level and the first bit line BLz is set to the L level, the first memory cell MCz is discharged (the internal logic is 0). As described above, in the first memory cell MCz, the external logic and the internal logic accordance.

On the other hand, when storing the logic 1 in the second memory cell MCx (the external logic is 1), the signal DATAz becomes the H level and the first bit line BLz is set to the H level. In this case, as the second bit line BLx is set to the L level, the second memory cell MCx coupled to the second bit line BLx is discharged (the internal logic is 0). When storing the logic 0 in the second memory cell MCx (the external logic is 0), the signal DATAz becomes the L level and the first bit line BLz is set to the L level. In this case, as the second bit line BLx is set to the H level, the second memory cell MCx coupled to the second bit line BLx is charged (the internal logic is 1). As described above, in the second memory cell MCx, the external logic and the internal logic are opposite to each other. However, when reading data from the second memory cell MCx as described later, as the logical value is read out inverted, correctly reading data from the respective memory cells is possible.

In both the NVM mode and the MID mode, as data is stored by the resistance value of the variable resistance 42, when writing data, the common circuits (FIGS. 6 to 8) can be used. The controller 30, by controlling the timing signals Timxpz and Timypz which control the gate voltage Vg and the drain voltage Vd of the select transistor 41, can control the voltage apply time for the memory cell to switch among the NVM mode, the RAM mode and the MID mode.

Figure 10:
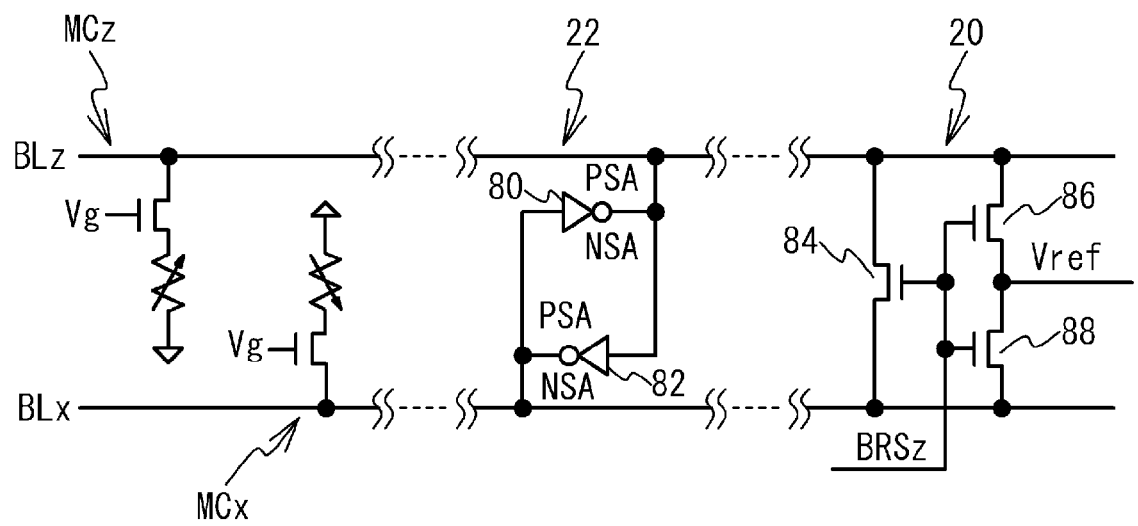
FIG. 10 is a schematic circuit diagram illustrating configurations of a reset circuit and a sense amplifier in accordance with various embodiments of the present invention.

Next, the specific circuit configurations and operations of the semiconductor device 100 relevant to data read will be described. FIG. 10 is a schematic circuit diagram illustrating the configurations of the memory cell array 10, the reset circuit 20 and the sense amplifier 22 of a detector circuit shown in FIG. 1. On the first bit line BLz, the first memory cell MCz is coupled to and the data stored in the first memory cell MCz is read out. On the second bit line BLx, the second memory cell MCx is coupled to and the data stored in the second memory cell MCx is read out.

The reset circuit 20 is provided in between the first bit line BLz and the second bit line BLx. A transistor 84 in the reset circuit 20, according to a reset signal BRSz, short-circuits the first bit line BLz and the second bit line BLx. Transistors 86 and 88, according to the reset signal BRSz, provide the reference voltage Vref to the first bit line BLz and the second bit line BLx.

The sense amplifier 22 is provided in between the first bit line BLz and the second bit line BLx and includes an inverter pair composed of inverters 80 and 82. The inverters 80 and 82 are supplied withthe power supply voltage Vcc and the ground voltage Vss by the sense amplifier driver 24. The sense amplifier 22, according to a latch signal LEz (not shown), amplifies a potential difference between the both bit lines. The reference voltage Vref is preferable to be one half of the power supply voltage Vcc. In the first embodiment, the Vcc is 1.2 V, and the Vref is 0.6 V.

Figure 11:
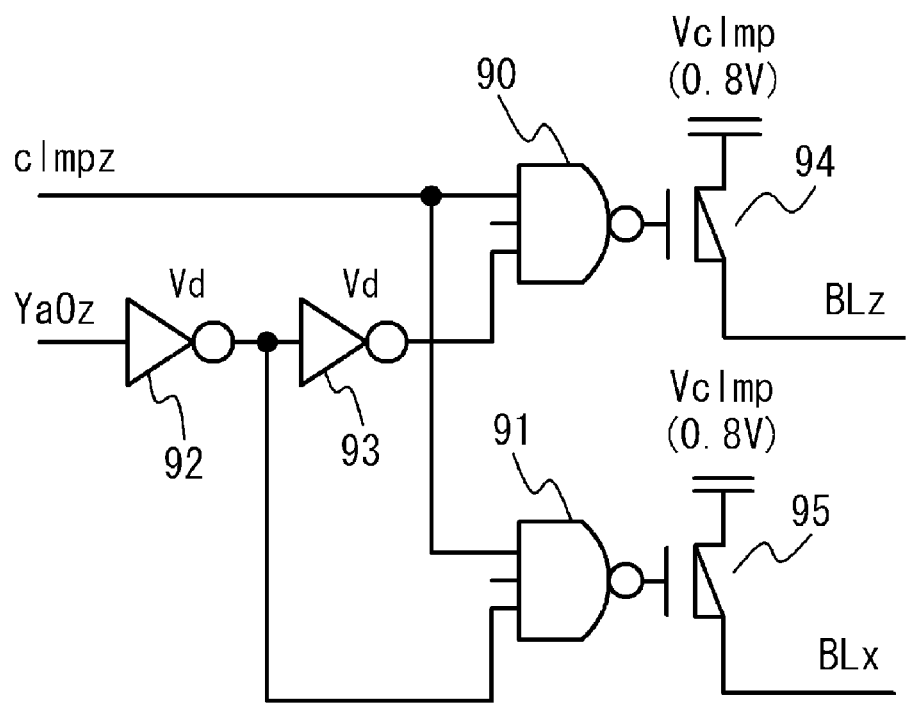
FIG. 11 is a schematic circuit diagram illustrating a configuration of a clamp circuit in accordance with various embodiments of the present invention.

FIG. 11 is a schematic circuit diagram illustrating the configuration of the clamp circuit 21 shown in FIG. 1. In some embodiments, the clamp circuit 21 is composed of NAND gates 90 and 91, inverters 92 and 93, and pMOS transistors 94 and 95. The source terminals of the pMOS transistors 94 and 95 are coupled with an output Vd of the voltage selector 60 shown in FIG. 7. When reading data, the pMOS transistor 68 in the voltage selector 60 is turned on and the clamp voltage Vclmp to read data is selected as the output Vd. The clamp voltage Vclmp is higher than the reference voltage Vref and, in the first embodiment, the Vclmp is 0.8 V.

In one embodiment, a clamp signal clmpz fed to the NAND gates 90 and 91 is the signal to activate the clamp circuit 21 and is set to the H level when reading data in the NVM mode and the MID mode. The address signal Ya0z fed to the inverter 92 is the signal to select, out of the bit line pair composed of the first bit line BLz and the second bit line BLx shown in FIG. 10, the bit line to be applied with the clamp voltage Vclmp. When the clamp signal clmpz is at the H level, according to the address signal Ya0z, the bit line which the clamp voltage Vclmp is applied to is selected. More specifically, when reading data from the first memory cell MCz, as the signal Ya0z becomes the H level and the pMOS transistor 94 is turned on, the clamp voltage Vclmp is applied to the first bit line BLz. When reading data from the second memory cell MCx, as the signal Ya0z becomes the L level and the pMOS transistor 95 is turned on, the clamp voltage Vclmp is applied to the second bit line BLx.

Figure 12:
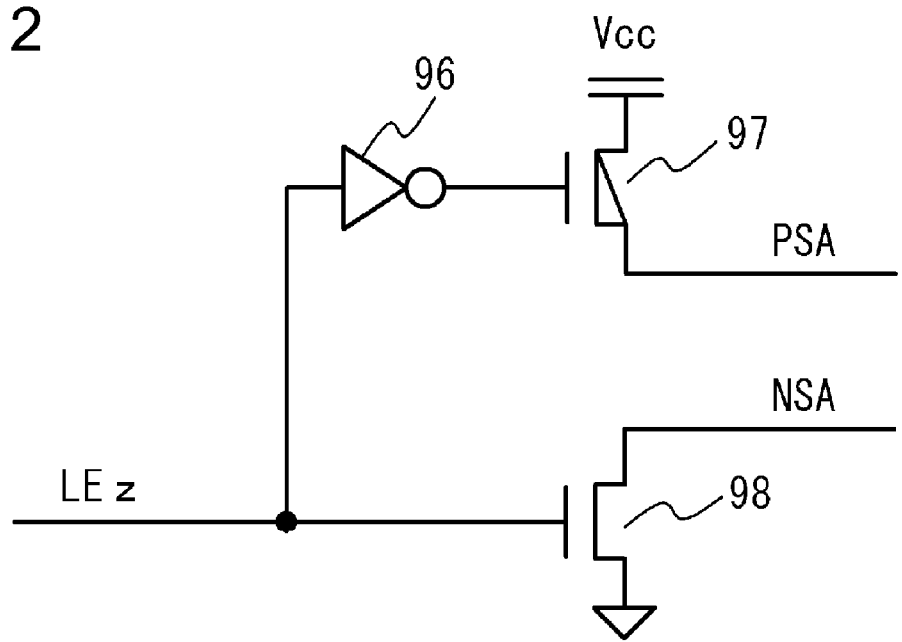
FIG. 12 is a schematic circuit diagram illustrating a configuration of a sense amplifier driver in accordance with various embodiments of the present invention.

FIG. 12 is a schematic circuit diagram illustrating the configuration of the sense amplifier driver 24 shown in FIG. 1. To the source terminal of a pMOS transistor 97, the power supply voltage Vcc is applied and, to the source terminal of an nMOS transistor 98, the ground voltage Vss is applied. The drain terminal PSA of the pMOS transistor 97 is coupled to a p-channel side of the sense amplifier 22 and the drain terminal NSA of the nMOS transistor 98 is coupled to an n-channel side of the sense amplifier 22. An inverter 96 feeds the latch signal LEz inverted to the gate terminal of the pMOS transistor 97. When the latch signal LEz is set to the H level, the pMOS transistor 97 and the nMOS transistor 98 are respectively turned on, and the terminal PSA is supplied with the power supply voltage Vcc and the terminal NSA is supplied with the ground voltage Vss.

Figure 13:
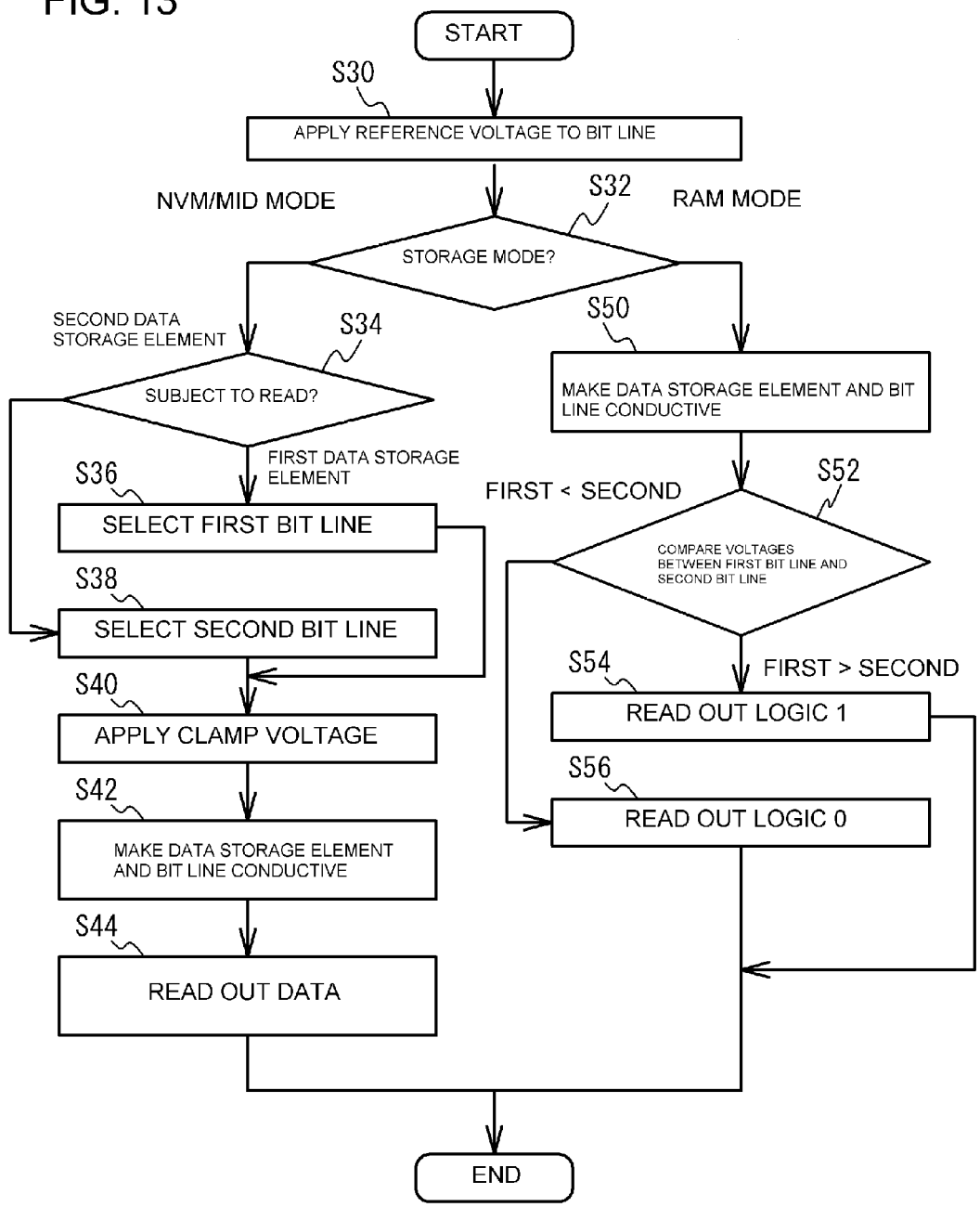
FIG. 13 is a flowchart showing a data read operation of the semiconductor device in accordance with various embodiments of the present invention.

FIG. 13 is a flowchart illustrating a control flow of the semiconductor device 100 in data read. In one embodiment, the controller 30 applies the reference voltage Vref to the first bit line BLz and the second bit line BLx (step S30) before carrying out data reading. With reference to FIG. 10, in this case, as the reset signal BRSz is delivered to the reset circuit 20 and the transistor 84 is turned on, the first bit line BLz and the second bit line BLx are short-circuited. As described later, after reading data, as one bit line of the bit line pair becomes the power supply voltage Vcc and the other one becomes the ground voltage Vss, by short-circuiting the both bit lines, the voltage of the bit lines can be controlled close to the reference voltage Vref (i.e., Vcc/2). Consequently, the power consumption of the circuit can be reduced. Further, at the same time, as the transistors 86 and 88 are turned on by the reset signal BRSz, the reference voltage Vref is supplied to the bit lines. Consequently, the first bit line BLz and the second bit line BLx are accurately set to the reference voltage Vref.

Next, in step S32, the controller 30 judges the storage mode. When in the NVM mode and the MID mode, a step S34 is proceeded to and, when in the RAM mode, step S50 is proceeded to.

In the NVM mode and the MID mode, the controller 30 judges the memory cell subject to read data (step S34). In one embodiment, the controller 30 selects the first bit line BLz when reading from the first memory cell MCz (step S36) or selects the second bit line BLx when reading from the second memory cell MCx (step S38), and applies the clamp voltage Vclmp to the selected bit line (step S40). The clamp voltage Vclmp is delivered from the clamp circuit 21 shown in FIG. 11. Consequently, the voltage of the bit line coupled to the memory cell subject to read data is raised up to the Vclmp which is higher than the reference voltage Vref and the voltage of the bit line not coupled to the memory cell subject to read data is maintained at the Vref.

In further embodiments, the controller 30 makes the data storage element 40 in the memory cell and the bit line conductive (step S42) by turning on the select transistor 41 of the memory cell subject to read data. When the variable resistance 42 in the data storage element 40 is in the high resistive state, as the current does not flow through the memory cell, the voltage of the bit line does not change and stays at the Vclmp and the voltage of the bit line coupled to the memory cell subject to read data becomes higher than the voltage Vref of the other bit lines. On the other hand, when the variable resistance 42 in the data storage element 40 is in the low resistive state, as the current flows through the memory cell, the voltage of the bit line falls from the Vclmp and the voltage of the bit line coupled to the memory cell subject to read data becomes lower than the voltage Vref of the other bit lines. As described above, the controller 30, by comparing the voltages between the first bit line BLz and the second bit line BLx, reads out data (step S44).

Figure 14:
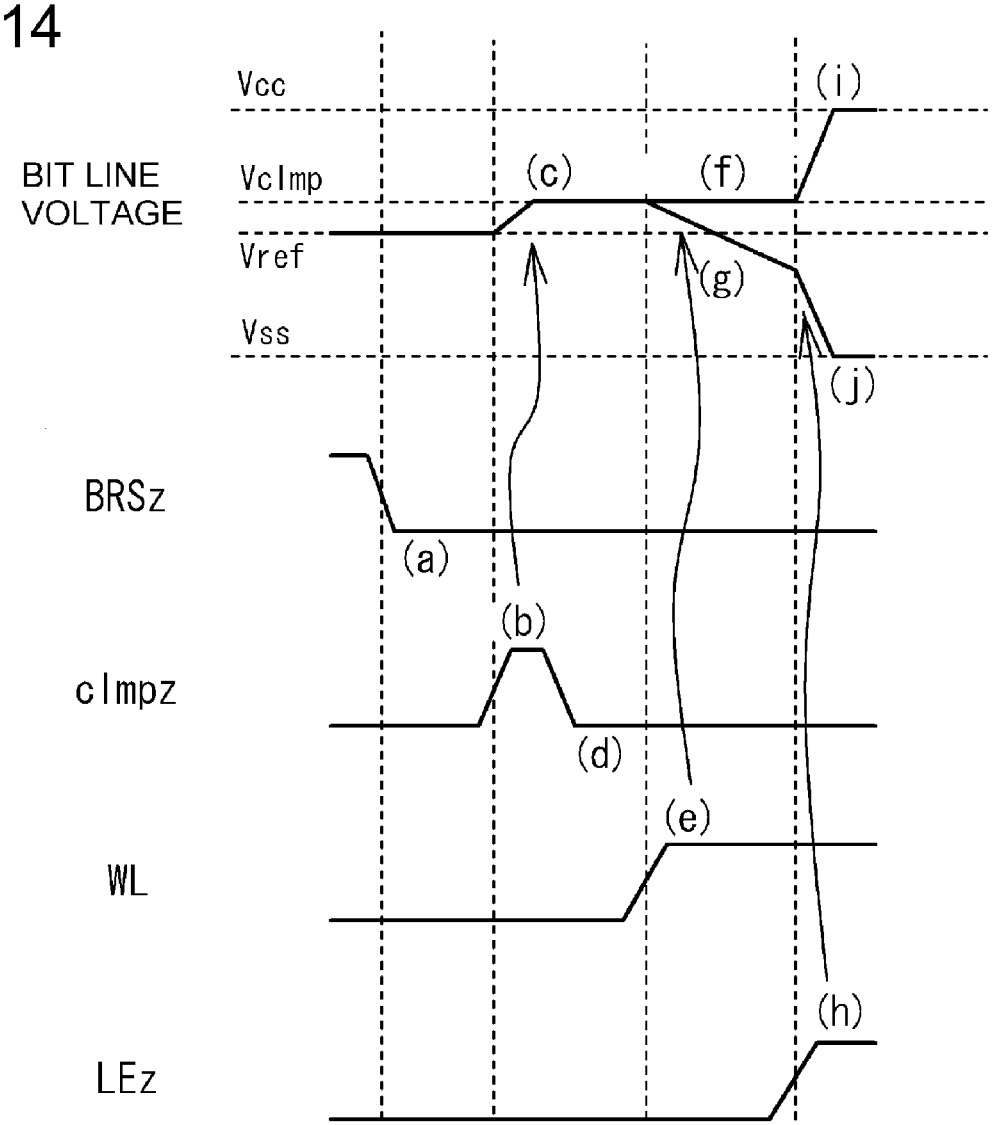
FIG. 14 is a timing chart of data read operation in an NVM mode in accordance with various embodiments of the present invention.

FIG. 14 is a timing chart illustrating data read operations in the NVM mode and the MID mode. By the reset signal BRSz delivered from the controller 30, the bit line voltage is maintained at the Vref. When reading data, the controller 30 sets the reset signal BRSz to the L level and the supply of the reset voltage Vref is stopped as shown by (a). Next, the controller 30 sets the clamp signal clmpz to the H level as shown by (b) making the bit line voltage rise up to the Vclmp as shown by (c) and sets the clamp signal clmpz to the L level again stopping the supply of the clamp voltage Vclmp as shown by (d). Next, the controller 30 raises the voltage of the word line WL (the gate voltage Vg of the select transistor 41) as shown by (e) making the data storage element 40 and the bit line conductive. When the logic 0 is stored in the data storage element, as the variable resistance 42 is in the high resistive state, the bit line voltage does not change as shown by (f). When the logic 1 is stored in the data storage element, as the variable resistance 42 is in the low resistive state, the bit line voltage falls down below the reference voltage Vref as shown by (g). Next, the controller 30 sets the latch signal LEz to the H level as shown by (h), making the bit line voltage rise up to the power supply voltage Vcc as shown by (i) when the bit line voltage is higher than the Vref, or fall down to the ground voltage Vss as shown by ( ) when the bit line voltage is lower than the Vref. Consequently, the signal read out from the data storage element 40 is amplified and taken out to the outside.

With reference to FIG. 13, in the RAM mode, the controller 30 turns on the select transistor 41 of the memory cell subject to read data, making the data storage element 40 in the memory cell and the bit line conductive (step S50). In the RAM mode, the clamp voltage Vclmp to the bit line is not supplied. When the data storage element 40 is in the charged state, as the electrical charges stored in the electrodes 44 are discharged to the bit line, the voltage of the bit line coupled to the memory cell subject to read data rises higher than the voltage Vref of the other bit lines. On the contrary, when the data storage element 40 is in the discharged state, as electrical charges are charged to the electrodes 44 from the bit line, the voltage of the bit line coupled to the memory cell subject to read data falls to be lower than the voltage Vref of the other bit lines. The controller 30 compares the voltages of the first bit line BLz and the second bit line BLx (step S52), and the logic 1 is read out when the voltage of the first bit line BLz is higher (step S54) or the logic 0 is read out when the voltage of the second bit line BLx is higher (step S56). This completes the operations of data read in the RAM mode.

The controller 30, when reading data in the RAM mode, reads out data based on the voltage level of the first bit line BLz. More specifically, when the first bit line BLz is at the H level, the logic 1 is read out and, when at the L level, the logic 0 is read out. As a result, when the memory cell subject to read data is the first memory cell MCz, the state of the first data storage element in the first memory cell MCz (the internal logic) and the logical value of the data read out (the external logic) agree. On the other hand, when the memory cell subject to read data is the second memory cell MCx, the state of the second data storage element in the second memory cell MCx (the internal logic) and the logical value of the data read out (the external logic) are opposite to each other. For example, when the second data storage element is in the discharged state (the internal logic is 0), as the first bit line BLz becomes the H level and the second bit line BLx becomes the L level in data read, the logic 1 is read out (the external logic is 1). When the second data storage element is in the charged state (the internal logic is 1), as the first bit line BLz becomes the L level and the second bit line BLx becomes the H level in data read, the logic 0 is read out (the external logic is 0). As described earlier, in the RAM mode, the internal logic which represents the status of the second data storage element and the external logic which represents the data stored in the second memory cell MCx are opposite to each other. Therefore, when reading out data from the second memory cell MCx, by reversing the internal logic and the external logic, the data can be correctly read out.

Figure 15:
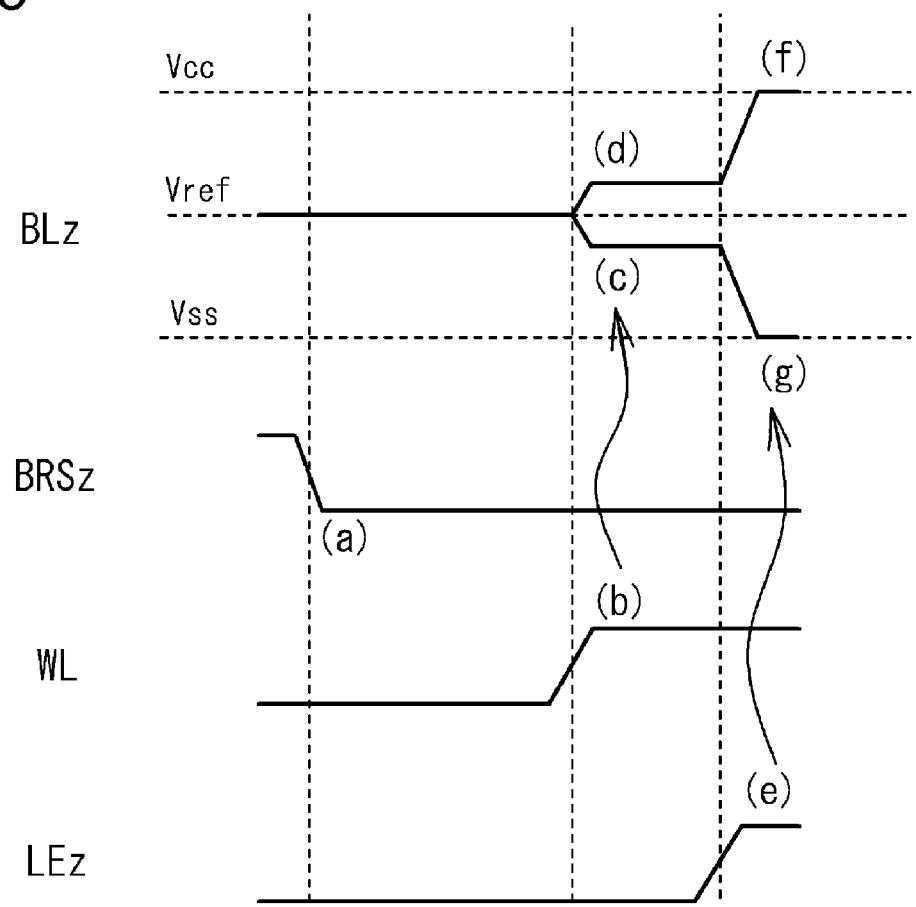
FIG. 15 is a timing chart of data read operation in a RAM mode in accordance with various embodiments of the present invention.

FIG. 15 is a timing chart illustrating data read operations in the RAM mode. In one embodiment, the bit line voltage is maintained at the Vref by the reset signal BRSz delivered from the controller 30. When reading data, the controller 30 sets the rest signal BRSz to the L level and the supply of the reset voltage Vref is stopped as shown by (a). Next, the controller 30 raises the voltage of the word line WL (the gate voltage Vg of the select transistor 41) as shown by (b), making the data storage element 40 and the bit line conductive. When the logic 0 is stored in the data storage element, as the electrodes 44 are in the discharged state, the bit line voltage falls down as shown by (c). When the logic 1 is stored in the data storage element, as the electrodes 44 are in the charged state, the bit line voltage rises up as shown by (d). Next, when the controller 30 sets the latch signal LEz to the H level as shown by (e), the bit line voltage rises up to the power supply voltage Vcc as shown by (f) when the bit line voltage is higher than the Vref or falls down to the ground voltage Vss as shown by (g) when the bit line voltage is lower than the Vref. Consequently, the signal read out from the data storage element 40 is amplified and taken out to the outside.

In the RAM mode and the MID mode, by refreshing the data storage element 40 at a constant interval, the data retention time can be extended.

Figure 16:
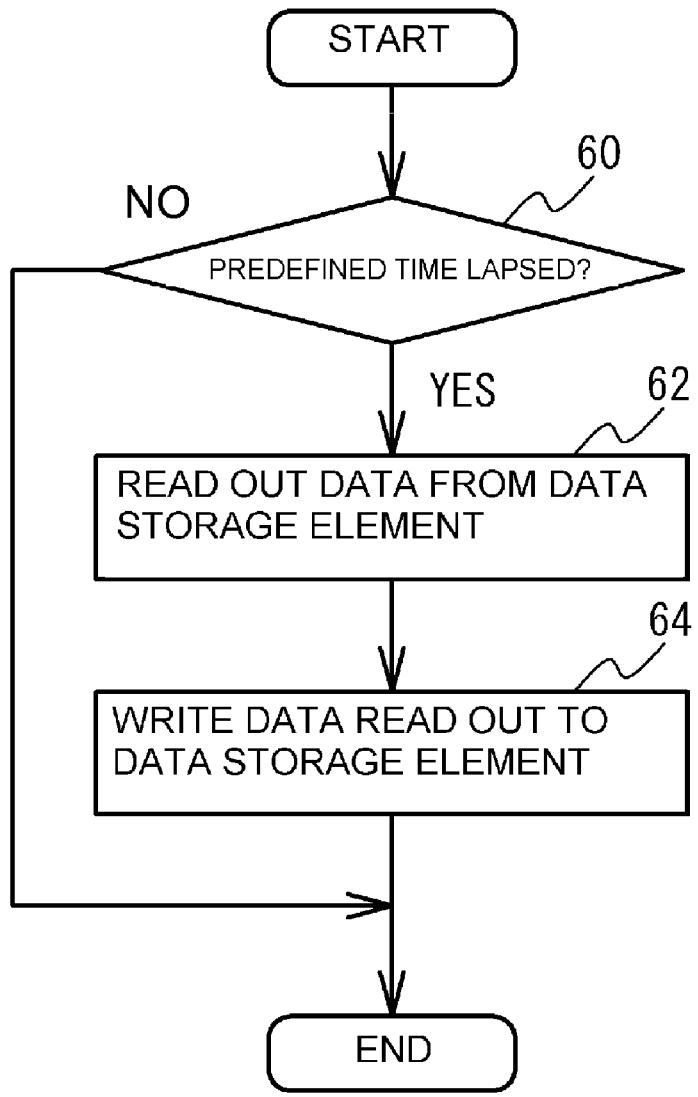
FIG. 16 is a flowchart showing a first sequence in a refresh operation of the semiconductor device in accordance with various embodiments of the present invention.

FIG. 16 is a flowchart illustrating a refresh operation of the semiconductor device 100 of the first embodiment. In one embodiment, the controller 30 judges whether or not a predefined time has passed from the previous data write or refresh operation in step S60. Here, the predefined time can be arbitrarily set, but must be shorter than the data retention time of the data storage element 40. For example, with reference to Table 3, the predefined time is set shorter than one second in the RAM mode, and is set shorter than one day in the MID mode. When the predefined time has passed, the controller 30 reads out data stored in the data storage element 40 (step S62) and writes the data identical to the data read out to the identical data storage element 40 again (step S64). This completes the refresh operation of the data storage element 40.

Figure 17:
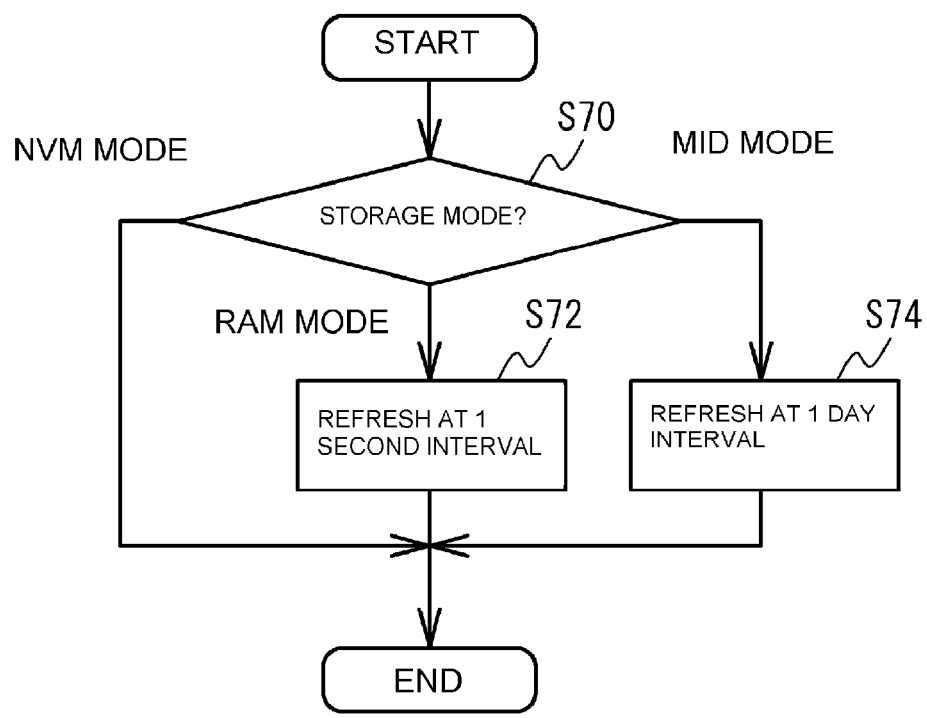
FIG. 17 is a flowchart showing a second sequence in a refresh operation of the semiconductor device in accordance with various embodiments of the present invention.

An interval of refresh operation can be changed for each mode. FIG. 17 is a flowchart illustrating the control of the refresh operation of the semiconductor device 100 of the first embodiment. At step S70, the controller 30 judges the storage mode. In the RAM mode, the refresh operation is carried out at, for example, an interval of one second (step S72) and, in the MID mode, the refresh operation is carried out at, for example, an interval of one day (step S74). As the data retention time in the MID mode is longer than that in the RAM mode, the controller 30 carries out data refreshing at a longer interval in the MID mode than that in the RAM mode. Further, as the data retention time is long in the NVM mode, the semiconductor device 100 can be used for example, without refreshing as shown in FIG. 17.

In one embodiment, the semiconductor device 100 is provided with the controller 30 which selects one storage mode out of three storage modes. With reference to Table 3, the NVM mode of a non-volatile property provides a long data retention time and is suitable for applications for storing data for a long time while the semiconductor device 100 is powered off. The RAM mode of a volatile property provides a short access time and is suitable for applications for fast data processing while the semiconductor device 100 is powered on. In the MID mode which lies halfway between the NVM mode and the RAM mode, an access time may be shorter than that in the NVM mode. Further, while a typical data retention time is for about one day, the data retention time can be extended by conducting the refresh operation. Therefore, in a system which carries out data refreshing, for example, the system can be practically used as a non-volatile memory about once every day, and is superior as a memory due to a shorter access time than that in the NVM mode. As for the other applications of the MID mode, by taking advantage of data being automatically lost after a lapse of a certain time, various applications can be conceived.

All three storage modes use the data storage element 40 as data storage. The data storage element 40 can store data by the resistance value of the variable resistance 42 and by the amount of electrical charges in the electrodes 44 and, by the controller 30 changing the voltage condition applied, can support a plurality of storage modes. Consequently, miniaturization and high density of the semiconductor device can be achieved. Furthermore, reduction of manufacturing cost can be promoted.

Further, as shown in FIG. 9, the controller 30 selects the bit line, to apply a high voltage according to the memory cell subject to write when writing data in the NVM mode. The controller 30 also selects the bit line to apply a high voltage according to the logical value of the storing data when writing data in the RAM mode. The selection of the bit line is, as shown in FIG. 8, carried out by switching the signal fed to the inverter to either the address signal Ya0z or the logical value DATAz. Therefore, according to different data storage methods of the NVM mode and the RAM mode, common circuit configurations can be used. Consequently, the semiconductor device can be miniaturized and the manufacturing cost can be reduced.

Further, as shown in FIGS. 10 and 12, for data read in the NVM mode and the RAM mode, the common circuit configurations (the reset circuit 20, the sense amplifier 22 and the sense amplifier driver 24) are used. Consequently, the semiconductor device can be miniaturized and the manufacturing cost can be reduced.

While the semiconductor device 100 having three storage modes has been illustrated, other configurations may be used with two or more storage modes out of three storage modes provided. For example, the semiconductor device may be provided with only the NVM mode and the RAM mode.

Figure 18:
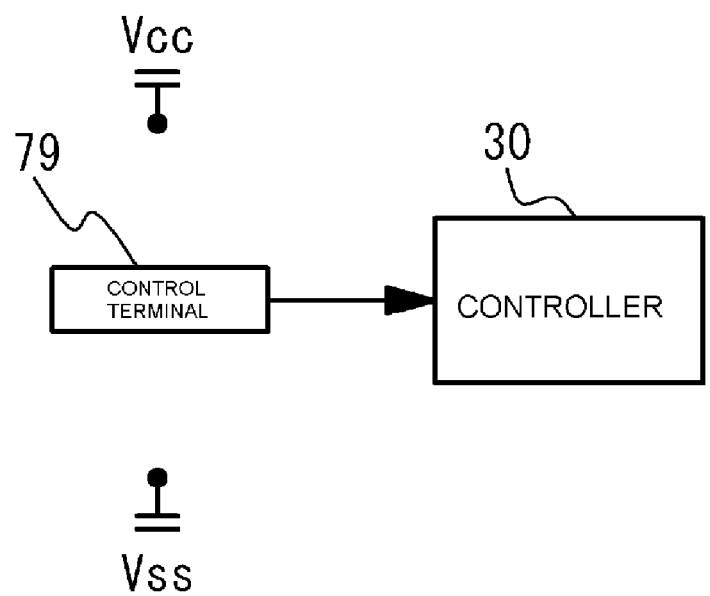
FIG. 18 is a schematic diagram illustrating a configuration of an alternate semiconductor device in accordance with various embodiments of the present invention.

Furthermore, while providing the select register 28 which stores the information relevant to the storage modes is illustrated (FIG. 1), the selection of storage mode may be carried out according to other methods. FIG. 18 is a schematic diagram illustrating a part of a configuration of another semiconductor device of the first embodiment. A control terminal 79 is coupled to the controller 30. The control terminal 79, by being coupled to either the power supply voltage Vcc or the ground voltage Vss, inputs the storage mode of the data storage element 40 to the controller 30. The controller 30 selects, according to the input from the control terminal 79, the mode of the data storage element 40. For example, the controller 30 is set to select the NVM mode when the control terminal 79 is coupled to the power supply voltage Vcc, the RAM mode when the control terminal 79 is coupled to the Vss, and the MID mode when the control terminal 79 is in floating. The control terminal 79 and the power supply terminal are coupled with, for example, by wire bonding and metal wiring. According to this method, the mode of the data storage element 40 can be mechanically fixed.

In further embodiments, while embodiments have been illustrated having all data storage elements 40 to be switched to the NVM mode, the RAM mode or the MID mode, for example, one half of the memory capacity range of the data storage elements 40 may be set to the NVM mode and the other half of the memory capacity range may be set to the RAM mode. Furthermore, the semiconductor device may be provided with three storage modes of the NVM mode, RAM mode and MID mode.

In addition, while embodiments have been provided which illustrate a select transistor 41 being used to control the voltage applied to the data storage element 40, as long as the voltage applied to the data storage element 40 can be controlled, other circuit elements may be used. For example, a diode may be used in place of the select transistor 41. Consequently, the semiconductor device 100 can be further miniaturized.

Also, while an embodiment has been provided which illustrates the transition metal oxide such as CuO as an example of variable resistance 42 included in the data storage element, a configuration with a phase change material such as chalcogenide of which resistance value varies with phase changes between a crystalline state and a non-crystalline state may also be used.

While an embodiment has been provided which illustrates the state of the variable resistance 42 to be in the high resistive state or the low resistive state in the NVM mode and the MID mode, and the state of the electrodes 44 to be in the charged state or the discharged state in the RAM mode, the variable resistance 42 and the electrodes 44 may take other states. For example, in the NVM mode or the MID mode, the state in which the resistance value of the variable resistance 42 to be in an intermediate resistance value between the high resistive state and the low resistive state may be further provided. Consequently, in a single data storage element, binary or more multi-valued data can be stored.

In some embodiments, when reading data in the NVM mode or the MID mode, after the clamp voltage Vclmp is delivered to the bit line by the controller 30 raising the clamp signal clmpz ((c) in FIG. 14), the controller 30 brings down the clamp signal clmpz to stop supplying the clamp voltage Vclmp to the bit line ((d) in FIG. 14). On the contrary, a configuration of a clamp resistance (not shown) being serially coupled to the bit line (variable resistance 42) to continuously supply the clamp voltage Vclmp to the bit line in the data read operation may be used. The resistance value of the clamp resistance is preferable to be an intermediate resistance value (e.g., $10^5$ ohms) between the resistance value in the low resistive state and the resistance value in the high resistive state of the variable resistance 42. Consequently, as the bit line is maintained at the clamp voltage Vclmp when the variable resistance 42 is in the high resistive state and, as the bit line voltage becomes below the clamp voltage Vclmp when the variable resistance 42 is in the low resistive state, data can be read out in the same manner as in the first embodiment.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A semiconductor device comprising:
   a data storage element having a variable resistance and an electrode; and
   a controller that selects between a first mode that stores data by a resistance value of the variable resistance, and a second mode that stores data by an amount of electrical charge stored in the electrode.

2. The semiconductor device according to claim 1, wherein
   the first mode stores data by changing the variable resistance to either a high resistive state or a low resistive state; and
   the second mode stores data by changing the electrode to either a charged state or a discharged state.

3. The semiconductor device according to claim 1, wherein the controller controls a time during which a voltage is applied to the data storage element when writing data in the first mode to be longer than a time during which a voltage is applied to the data storage element when writing data in the second mode.

4. The semiconductor device according to claim 2, wherein the controller maintains the variable resistance at the high resistive state when the second mode is selected.

5. The semiconductor device according to claim 4, wherein when writing data in the second mode, the controller controls the voltage applied to the electrode to be lower than a threshold voltage for changing the variable resistance from the high resistive state to the low resistive state.

6. The semiconductor device according to claim 5, wherein when writing data in the first mode, the controller applies a voltage higher than the threshold voltage to the data storage element when changing the variable resistance to the low resistive state, and applies a voltage lower than the threshold voltage to the data storage element for a longer time than when changing the variable resistance to the low resistive state when changing the variable resistance to the high resistive state.

7. The semiconductor device according to claim 2, further comprising:
   a select transistor in which either a source or a drain is coupled to the data storage element; wherein
   the controller controls a current flowing through the data storage element by controlling a gate voltage of the select transistor, and controls a gate voltage when changing the variable resistance to the low resistive state when writing data in the first mode to be smaller than a gate voltage when changing the variable resistance to the high resistive state when writing data in the first mode and when in the second mode.

8. The semiconductor device according to claim 1, wherein the controller performs a refresh operation of the data storage element when the second mode is selected.

9. The semiconductor device according to claim 1, further comprising:
the data storage element including a first data storage element and a second data storage element; and
a plurality of bit lines comprising a first bit line to which the first data storage element is coupled and a second bit line to which the second data storage element is coupled; wherein
the controller sets the first bit line to a high level and the second bit line to a voltage level lower than the high level when writing to the first data storage element, and sets the second bit line to the high level and the first bit line to a voltage level lower than the high level when writing to the second data storage element when writing data in the first mode; and
the controller sets the first bit line to a high level and the second bit line to a low level when writing a logical high to the first data storage element and the second data storage element, and sets the first bit line to the low level and the second bit line to the high level when writing a logical low to the first data storage element and the second data storage element when writing data in the second mode.

10. The semiconductor device according to claim 9, wherein
the controller applies a voltage for changing the variable resistance to either a high resistive state or a low resistive state to a bit line which is set to a high level among the first bit line and the second bit line when writing data in the first mode; and
the controller applies a voltage for charging electrical charges to the electrode to a bit line which is set to a high level among the first bit line and the second bit line, and applies a voltage for discharging the electrode to a bit line set to a low level when writing data in the second mode.

11. The semiconductor device according to claim 1, further comprising:
the data storage element including a first data storage element and a second data storage element; and
a pair of bit lines comprising a first bit line to which the first data storage element is coupled and a second bit line to which the second data storage element is coupled; wherein
the controller reads out data by raising the second bit line up to a reference voltage that is referred to when reading data, raising the first bit line to a voltage higher than the reference voltage, conducting the first data storage element and the first bit line, and comparing voltages, after performing the conducting, of the first bit line and the second bit line when reading out data from the first data storage element in the first mode; and
the controller reads out data by raising the first bit line and the second bit line up to the reference voltage, conducting the data storage element and the first bit line, and comparing voltages, after performing the conducting, of the first bit line and the second bit line when reading out data from the first data storage element in the second mode.

12. The semiconductor device according to claim 11, further comprising:
a detector circuit coupled to the first bit line and the second bit line; wherein
the controller performs a control such that, when reading data in the first mode and the second mode, a potential difference between the first bit line and the second bit line in the detector circuit is amplified.

13. The semiconductor device according to claim 12, wherein the detector circuit is used in common in the first mode and the second mode.

14. The semiconductor device according to claim 11, wherein the controller short-circuits, when reading data in the first mode and the second mode, the first bit line and the second bit line after reading data.

15. The semiconductor device according to claim 2, wherein
the controller selects, in addition to the first mode and the second mode, a third mode that stores data by changing the variable resistance to either a high resistive state or a low resistive state;
a resistance value when the variable resistance is in the high resistive state in the third mode is smaller than a resistance value when the variable resistance is in the high resistive state in the first mode; and
a resistance value when the variable resistance is in the low resistive state in the third mode is larger than a resistance value when the variable resistance is in the low resistive state in the first mode.

16. The semiconductor device according to claim 15, wherein the controller controls a time during which a voltage is applied to the data storage element when writing data in the third mode to be shorter than a time during which a voltage is applied to the data storage element when writing data in the first mode, and also to be longer than a time during which a voltage is applied to the data storage element when writing data in the second mode.

17. The semiconductor device according to claim 16, wherein
the controller applies a voltage higher than a threshold voltage for changing the variable resistance from the high resistive state to the low resistive state to the data storage element when changing the variable resistance to the low resistive state when writing data in the third mode, and
the controller applies a voltage lower than the threshold voltage to the data storage element for a longer time than when changing the variable resistance to the low resistive state when changing the variable resistance to the high resistive state.

18. The semiconductor device according to claim 16, further comprising:
a select transistor in which either a source or a drain is coupled to the data storage element; wherein
the controller controls a current flowing through the data storage element by controlling a gate voltage of the select transistor, and controls a gate voltage when changing the variable resistance to the low resistive state when writing data in the third mode to be smaller than a gate voltage when changing the variable resistance to the high resistive state when writing data in the third mode and when in the second mode.

19. The semiconductor device according to claim 15, wherein the controller performs a refresh operation of the data storage element at a longer interval than when the second mode is selected when writing data in the third mode.

20. The semiconductor device according to claim 1, further comprising:
a select register that stores a mode of the data storage element; wherein
the controller selects a mode of the data storage element by referencing a value of the select transistor.

21. The semiconductor device according to claim 1, further comprising:
a control terminal that inputs a mode of the data storage element to the controller; wherein
the controller selects a mode of the data storage element according to an input from the control terminal.

22. A method for controlling a semiconductor device that includes a data storage element including a variable resistance and an electrode, the method comprising:
selecting a first stage that stores data by changing the variable resistance to either a high resistive state or a low resistive state, and a second stage that stores data by an amount of electrical charges stored in the electrode.

23. The method for controlling a semiconductor device according to claim 22, wherein
the first stage includes writing data by applying a first voltage to the data storage element;
the second stage includes writing data by applying a second voltage to the data storage element; and
a time during which the first voltage is applied is longer than a time during which the second voltage is applied.

24. The method for controlling a semiconductor device according to claim 22, wherein the writing of the data to the data storage element in the first stage comprises:
setting a first bit line to a high level and a second bit line to a voltage level lower than the high level when writing to a first data storage element;
setting the second bit line to a high level and the first bit line to a voltage level lower than the high level when writing to a second data storage element.

25. The method for controlling a semiconductor device according to claim 22, wherein the writing of the data to the data storage element in the second stage comprises:
setting the first bit line to a high level and the second bit line to a low level when writing a logical high to the first data storage element and the second data storage element; and
setting the first bit line to a low level and the second bit line to a high level when writing a logical low to the first data storage element and the second data storage element.

26. The method for controlling a semiconductor device according to claim 22, wherein the first stage comprises:
raising a second bit line up to a reference voltage that is referred to when reading data;
raising a first bit line to a voltage higher than the reference voltage;
conducting a data storage element and the first bit line; and
reading out data by comparing voltages of the first bit line and the second bit line, wherein reading out data is performed after conducting the data storage element and the first bit line.

27. The method for controlling a semiconductor device according to claim 22, wherein the second stage comprises:
raising a first bit line and a second bit line up to a reference voltage;
conducting a data storage element and the first bit line; and
reading out data by comparing voltages of the first bit line and the second bit line, wherein reading out data is performed after performing conducting the data storage element and the first bit line.

28. The method for controlling a semiconductor device according to claim 22, further comprising:
selecting any one of the first stage, the second stage, or a third stage that stores data by changing the variable resistance to either a high resistive state or a low resistive state; wherein
a resistance value when the variable resistance is in the high resistive state in the third stage is smaller than a resistance value when the variable resistance is in the high resistive state in the first stage; and
a resistance value when the variable resistance is in the low resistive state in the third stage is larger than a resistance value when the variable resistance is in the low resistive state in the first stage.

29. The method for controlling a semiconductor device according to claim 28, wherein the third stage comprises:
writing data by applying a third voltage to the data storage element; wherein
a time during which the third voltage is applied is shorter than a time during which the first voltage is applied and is longer than a time during which the second voltage is applied.

* * * * *